(12) United States Patent
Zou et al.

(10) Patent No.: US 11,361,704 B2
(45) Date of Patent: Jun. 14, 2022

(54) SHIFT REGISTER UNIT, GATE DRIVE CIRCUIT, DISPLAY DEVICE AND METHOD OF DRIVING GATE DRIVE CIRCUIT

(71) Applicants: Hefei Xinsheng Optoelectronics Technology Co., Ltd., Anhui (CN); BOE Technology Group Co., Ltd., Beijing (CN)

(72) Inventors: Yifeng Zou, Beijing (CN); Hui Wang, Beijing (CN); Xiong Xiong, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 309 days.

(21) Appl. No.: 16/482,538

(22) PCT Filed: Oct. 25, 2018

(86) PCT No.: PCT/CN2018/111918
§ 371 (c)(1),
(2) Date: Jul. 31, 2019

(87) PCT Pub. No.: WO2019/184323
PCT Pub. Date: Oct. 3, 2019

(65) Prior Publication Data
US 2021/0335209 A1    Oct. 28, 2021

(30) Foreign Application Priority Data

Mar. 30, 2018   (CN) .......................... 201810293238.6

(51) Int. Cl.
*G09G 3/32*           (2016.01)
(52) U.S. Cl.
CPC ....... *G09G 3/32* (2013.01); *G09G 2300/0408* (2013.01); *G09G 2310/0267* (2013.01);
(Continued)

(58) Field of Classification Search
CPC ... G09G 3/32–3291; G09G 2300/0408; G09G 2310/02; G09G 2310/0202;
(Continued)

(56) References Cited

U.S. PATENT DOCUMENTS 10,283,030 B2    5/2019  Zhou et al.
10,460,652 B2   10/2019  Li
(Continued)

FOREIGN PATENT DOCUMENTS

CN        102629459 A     8/2012
CN        103928001 A     7/2014
(Continued)

OTHER PUBLICATIONS

Nov. 2, 2021—(EP) Extended European Search Report Appn 18901805.4.

*Primary Examiner* — Nathan Danielsen
(74) *Attorney, Agent, or Firm* — Banner & Witcoff, Ltd.

(57)                ABSTRACT

A shift register unit, a gate drive circuit, a display device and a method of driving a gate drive circuit are provided. The shift register unit includes a shift register circuit and an output control circuit. The shift register circuit is configured to output a valid output level at a first output terminal according to a first input signal received by a first input terminal, and is configured to reset according to a first reset signal received by a first reset terminal. The output control circuit is configured to output an invalid output level at the second output terminal according to a second input signal received by the second input terminal, thereby controlling a level of the first output terminal to the invalid output level, and is configured to reset according to a second reset signal received by the second reset terminal.

18 Claims, 13 Drawing Sheets

(52) U.S. Cl.
CPC ............... *G09G 2310/0286* (2013.01); *G09G 2310/061* (2013.01)

(58) Field of Classification Search
CPC ... G09G 2310/0243; G09G 2310/0267; G09G 2310/0286; G09G 2310/0291; G09G 2310/06; G09G 2310/061; G09G 2310/08; G09G 2320/2019; G09G 2320/0233; G09G 2320/0242; G09G 2320/0257; G09G 2320/0266
See application file for complete search history.

(56) References Cited

U.S. PATENT DOCUMENTS

| | | | |
|---|---|---|---|
| 10,916,320 | B2 | 2/2021 | Chen et al. |
| 10,950,153 | B2 | 3/2021 | Zhao et al. |
| 2008/0042965 | A1 | 2/2008 | Cheng et al. |
| 2012/0242630 | A1 | 9/2012 | Ohara |
| 2012/0326955 | A1* | 12/2012 | Ohara ................... G09G 3/3677 345/92 |
| 2015/0029174 | A1 | 1/2015 | Otose |
| 2017/0178749 | A1* | 6/2017 | Ma ....................... G09G 3/2096 |
| 2017/0270851 | A1* | 9/2017 | Shang .................. G09G 3/2092 |
| 2018/0108290 | A1* | 4/2018 | Chen .................... G11C 19/287 |
| 2020/0357352 | A1* | 11/2020 | Du ......................... G11C 19/28 |

FOREIGN PATENT DOCUMENTS

| | | |
|---|---|---|
| CN | 106023936 A | 10/2016 |
| CN | 106448536 A | 2/2017 |
| CN | 106898292 A | 6/2017 |
| CN | 106910470 A | 6/2017 |
| CN | 107256701 A | 10/2017 |
| WO | 2017173818 A1 | 10/2017 |

* cited by examiner

US 11,361,704 B2

SHIFT REGISTER UNIT, GATE DRIVE CIRCUIT, DISPLAY DEVICE AND METHOD OF DRIVING GATE DRIVE CIRCUIT

The application is a U.S. National Phase Entry of International Application No. PCT/CN2018/111918 filed on Oct. 25, 2018, designating the United States of America and claiming priority to Chinese Patent Application No. 201810293238.6, filed on Mar. 30, 2018. The present application claims priority to and the benefit of the above-identified applications and the above-identified applications are incorporated by reference herein in their entirety.

TECHNICAL FIELD

Embodiments of the present disclosure relate to a shift register unit, a gate drive circuit, a display device and a method of driving a gate drive circuit.

BACKGROUND

In the field of display technology, pixel arrays of, for example, liquid crystal display panel, usually include a plurality of rows of gate lines and a plurality of columns of data lines staggered therewith. The gate lines can be driven by a bounded integrated drive circuit. In recent years, with the continuous improvement of the preparation technology in amorphous silicon thin film transistors or oxide thin film transistors, it is also possible to directly integrate the gate driver circuit on an array substrate having the thin film transistors to form a gate driver on array (GOA) to drive the gate lines. For example, the GOA includes a plurality of shift register units that are cascaded, and can be used to provide voltage signals with on-state or off-state to the plurality of rows of gate lines of the pixel array, so as to control the plurality of rows of gate lines to be sequentially turned on, for example, to perform progressive scanning, and at the same time, data signals are provided to the pixel units of corresponding rows in the pixel array from the data lines, to form gray-scale voltages required for each gray-scale of the displayed image in each pixel unit, thereby displaying a frame of image.

SUMMARY

At least one embodiment of the present disclosure provides a shift register unit, which comprises a shift register circuit and an output control circuit. The shift register circuit comprises a first input terminal, a first output terminal and a first reset terminal, and the shift register circuit is configured to output a valid output level at the first output terminal according to a first input signal received by the first input terminal and is configured to reset according to a first reset signal received by the first reset terminal; and the output control circuit comprises a second input terminal, a second output terminal and a second reset terminal, the second output terminal is electrically connected to the first output terminal, and the output control circuit is configured to output an invalid output level at the second output terminal according to a second input signal received by the second input terminal, thereby controlling a level of the first output terminal to be the invalid output level, and is configured to reset according to a second reset signal received by the second reset terminal.

For example, in the shift register unit provided by some embodiments of the present disclosure, the output control circuit further comprises a control selection sub-circuit, and the control selection sub-circuit is configured to output the invalid output level at the second output terminal under control of a level of a first node, thereby controlling the level of the first output terminal at the invalid output level during a non-output period.

For example, in the shift register unit provided by some embodiments of the present disclosure, the output control circuit further comprises a first node control sub-circuit and a first node reset sub-circuit; the first node control sub-circuit is configured to adjust the level of the first node to a level that turns on the control selection sub-circuit, in response to the second input signal; and the first node reset sub-circuit is configured to reset the first node in response to the second reset signal.

For example, in the shift register unit provided by some embodiments of the present disclosure, the control selection sub-circuit comprises a first transistor, a gate electrode of the first transistor is connected to the first node, a first electrode of the first transistor is connected to the second output terminal, and a second electrode of the first transistor is connected to a first voltage terminal to receive a first voltage.

For example, in the shift register unit provided by some embodiments of the present disclosure, the first node control sub-circuit comprises a second transistor and a first storage capacitor; a gate electrode of the second transistor and a first electrode of the second transistor are electrically connected to each other, and are both configured to be connected to the second input terminal to receive the second input signal, and a second electrode of the second transistor is configured to be connected to the first node; and a first electrode of the first storage capacitor is connected to the first node, and a second electrode of the first storage capacitor is connected to a reference voltage terminal to receive a reference voltage.

For example, in the shift register unit provided by some embodiments of the present disclosure, the first node reset sub-circuit comprises a third transistor, a gate electrode of the third transistor is connected to the second reset terminal to receive the second reset signal, a first electrode of the third transistor is connected to the first node, and a second electrode of the third transistor is connected to a first voltage terminal to receive a first voltage.

For example, in the shift register unit provided by some embodiments of the present disclosure, the shift register circuit further comprises an input circuit, a pull-up node reset circuit and an output circuit; the input circuit is connected to the first input terminal and is configured to control a level of a pull-up node according to the first input signal received by the first input terminal; the pull-up node reset circuit is connected to the first reset terminal and is configured to reset the pull-up node according to the first reset signal received by the first reset terminal; and the output circuit is connected to the first output terminal and is configured to output a clock signal to the first output terminal under control of the level of the pull-up node.

At least one embodiment of the present disclosure further provides a gate drive circuit, which comprises a plurality of shift register units that are cascaded described above.

For example, in the gate drive circuit provided by some embodiments of the present disclosure, except for last m shift register units, a second input terminal of each of other shift register units is connected to a first output terminal of a hind shift register unit which is separated by m−1 shift register units; except for a first to a mth shift register units, a first input terminal of each of other shift register units is connected to a first output terminal of a front shift register unit which is separated by m−1 shift register units; except for the last m shift register units, a first reset terminal of each of the other shift register units is connected to the first output terminal of the hind shift register unit which is separated by the m−1 shift register units; and m is an integer greater than 0.

For example, the gate drive circuit provided by some embodiments of the present disclosure further comprises a trigger signal line, and a second reset terminal of each of the shift register units is connected to the trigger signal line.

For example, in the gate drive circuit provided by some embodiments of the present disclosure, except for the first to the mth shift register units, a second reset terminal of each of the other shift register units is connected to the first output terminal of the front shift register unit which is separated by the m−1 shift register units.

At least one embodiment of the present disclosure further provides a display device, which comprises the gate drive circuit described above.

At least one embodiment of the present disclosure further provides a method of driving the gate drive circuit described above, and the method comprises: controlling a second output terminal of an output control circuit of an Nth shift register unit to output the invalid output level during a period when a first output terminal of a shift register circuit of the Nth shift register unit does not output the valid output level; resetting a first node of the output control circuit of the Nth shift register unit before the first output terminal of the shift register circuit of the Nth shift register unit enters the period when the valid output level is output; and N is an integer greater than 0.

For example, in the method provided by some embodiments of the present disclosure, controlling the second output terminal of the output control circuit of the Nth shift register unit to output the invalid output level during the period when the first output terminal of the shift register circuit of the Nth shift register unit does not output the valid output level, comprises: during the period when the first output terminal of the shift register circuit of the Nth shift register unit does not output the valid output level, a third transistor being turned off under control of the second reset signal, and a second transistor being turned on in response to the second input signal received by the second input terminal, thereby controlling a level of a first node so that a first transistor is turned on under control of the level of the first node, to connect the second output terminal with a first voltage terminal, to control the second output terminal to output the invalid output level.

For example, in the method provided by some embodiments of the present disclosure, resetting the first node of the output control circuit of the Nth shift register unit before the first output terminal of the shift register circuit of the Nth shift register unit enters the period when the valid output level is output, comprises: before the first output terminal of the shift register circuit of the Nth shift register unit enters the period when the valid output level is output, a second transistor being turned off under control of the second input signal received by the second input terminal, and a third transistor being turned on under control of the second reset signal, so that the first node is connected to a first voltage terminal, thereby resetting the first node, to turn off a first transistor under control of a level of the first node.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
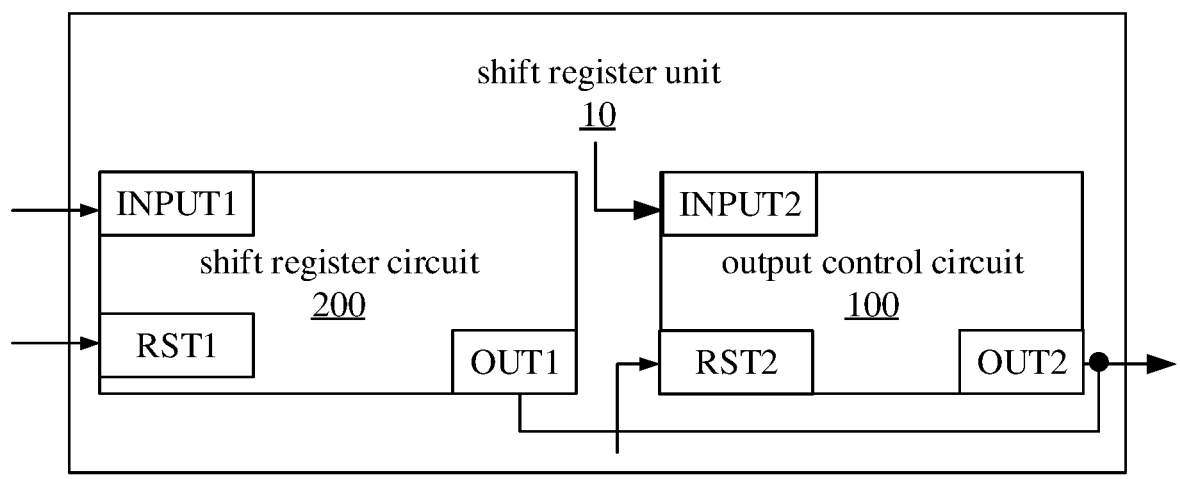
FIG. 1 is a schematic diagram of a shift register unit according to some embodiments of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below by several specific examples. In order to keep the following description of embodiments of the present disclosure clear and concise, detailed descriptions of known functions and known components may be omitted. When any component of an embodiment of the present disclosure appears in more than one drawing, the component is denoted by the same reference number in each drawing.

In display panel technologies, in order to realize low cost and narrow frame, a GOA technology can be adopted, i.e., a gate drive circuit is prepared on an array substrate of a display panel by a semiconductor preparation process, thus realizing narrow frame and reducing assembly cost, etc. However, due to the non-uniform characteristics of transistors in the GOA units, or the influence of factors such as electromagnetic interference on the clock signal, the GOA units may have a multi-output phenomenon. Therefore, on the one hand, due to the multi-output phenomenon of the GOA unit, pixel circuits connected to this GOA unit may be wrongly charged, and meanwhile, due to the cascade relationship between the front and hind GOA units, GOA units of other rows connected to the GOA unit of this row may also generate an output phenomenon, thus causing pixel circuits connected to the GOA units of other rows to be wrongly charged, which may cause display abnormality of the corresponding display panel. On the other hand, because there is no effective monitoring mechanism for such GOA units, the reliability of the products cannot be guaranteed, thus greatly reducing the quality and usage effect of the products.

An embodiment of the present disclosure provides a shift register unit, which includes a shift register circuit and an output control circuit. The shift register circuit includes a first input terminal, a first output terminal, and a first reset terminal. The shift register circuit is configured to output a valid output level at the first output terminal according to a first input signal received by the first input terminal, and is configured to reset according to a first reset signal received by the first reset terminal. The output control circuit comprises a second input terminal, a second output terminal and a second reset terminal, the second output terminal is electrically connected to the first output terminal, and the output control circuit is configured to output an invalid output level at the second output terminal according to a second input signal received by the second input terminal, thereby controlling a level of the first output terminal to be the invalid output level, and is configured to reset according to a second reset signal received by the second reset terminal. The embodiments of the present disclosure also provide a gate drive circuit including the shift register unit described above, a display device and a method of driving the gate drive circuit.

In the shift register unit, the gate drive circuit, the display device and the method of driving the gate drive circuit provided by the embodiments of the present disclosure, on the one hand, the output control circuit controls the level of the output terminal of the shift register unit, thereby effectively avoiding the multi-output phenomenon of the shift register unit; on the other hand, the output control circuit is controlled to be turned on or turned off by the output signal of the shift register units that are cascaded or the trigger signal of the next frame, thus realizing automatic control of the level of the output terminal of the shift register unit, thereby ensuring normal display of the display panel.

The embodiments of the present disclosure and examples thereof are described in detail below with reference to the accompanying drawings.

FIG. 1 is a schematic diagram of a shift register unit according to some embodiments of the present disclosure. As illustrated in FIG. 1, a shift register unit 10 includes an output control circuit 100 and a shift register circuit 200.

The shift register circuit 200 includes a first input terminal INPUT1, a first output terminal OUT1, and a first reset terminal RST1. The shift register circuit 200 is configured to output a valid output level at the first output terminal OUT1 according to a first input signal received by the first input terminal INPUT1, and is configured to reset according to a first reset signal received by the first reset terminal RST1.

The output control circuit 100 includes a second input terminal INPUT2, a second output terminal OUT2, and a second reset terminal RST2. The second output terminal OUT2 is electrically connected to the first output terminal OUT1. The output control circuit 100 is configured to output an invalid output level at the second output terminal OUT2 according to a second input signal received by the second input terminal INPUT2, thereby controlling a level of the first output terminal OUT1 to the invalid output level, and is configured to reset according to a second reset signal received by the second reset terminal RST2.

For example, the first output terminal OUT1 and the second output terminal OUT2 are connected to a gate line to drive pixel circuits connected to the gate line.

It should be noted that the "valid output level" in the shift register unit in the present disclosure refers to a level that enables the switching transistor in the pixel circuit connected thereto to be turned on so that data signals can be written into the pixel circuit, and correspondingly, the "invalid output level" refers to a level that cannot enable the switching transistor in the pixel circuit connected thereto to be turned on (i.e., the switching transistor is turned off). The valid output level may be higher or lower than the invalid output level. Generally, the shift register unit outputs a square wave pulse signal at the output terminal during operation, the valid output level corresponds to the level of the square-wave-pulse portion of the square wave pulse signal, and the invalid output level corresponds to the level of the non-square-wave-pulse portion.

For example, the second input signal may be an output signal of a first output terminal of a hind shift register unit cascaded with the shift register unit 10 in a gate drive circuit, so that the first output terminal OUT1 of the shift register circuit 200 outputs the invalid output level when the first output terminal of the hind shift register circuit outputs the valid output level, thereby avoiding the multi-output phenomenon of the first output terminal of the shift register circuit.

For example, the second reset signal may be an output signal of a first output terminal of a front shift register unit cascaded with the shift register unit 10 in the gate drive circuit or a trigger signal of a next frame, so as to ensure that the first output terminal of the shift register unit 10 can normally output during the next scanning, thereby realizing automatic control of the level of the first output terminal of the shift register circuit and ensuring normal display of the display panel.

Figure 2:
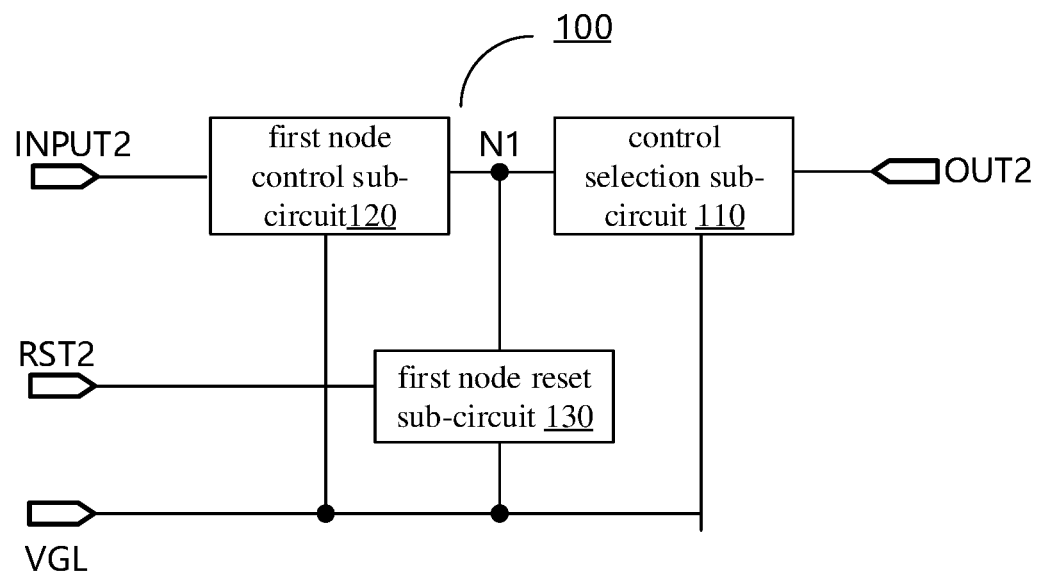
FIG. 2 is a schematic diagram of an output control circuit according to some embodiments of the present disclosure.

FIG. 2 is a schematic diagram of an exemplary output control circuit provided by some embodiments of the present disclosure. As illustrated in FIG. 2, the output control circuit 100 includes a control selection sub-circuit 110, a first node control sub-circuit 120, and a first node reset sub-circuit 130.

The control selection sub-circuit 110 is configured to output the invalid output level at the second output terminal OUT2 under control of a level of a first node N1, thereby controlling a level of the first output terminal OUT1 to be the invalid output level during a non-output period. For example, the control selection sub-circuit 110 can be connected to the first node N1, the second output terminal OUT2, and a first voltage terminal VGL, and is configured to be turned on under control of the level of the first node N1 such that the second output terminal OUT2 is electrically connected to the first voltage terminal VGL to receive a first voltage, and for example, the first voltage is the invalid output level, for example, a low level, thereby controlling the level of the first output terminal OUT1.

The first node control sub-circuit 120 is configured to charge the first node N1 in response to the second input signal, to adjust the level of the first node N1 to the level which can turn on the control selection sub-circuit 110. For example, the first node control sub-circuit 120 is connected to the second input terminal INPUT2, the first node N1, and the first voltage terminal VGL, and is configured to charge the first node N1 under control of the input signal received by the second input terminal INPUT2, to adjust the level of the first node N1 to the level which can turn on the control selection sub-circuit 110. For example, in a case where the second input signal is the valid output level, that is, in a case where an output signal output from a first output terminal of a hind shift register unit cascaded with the shift register unit 10 is the valid output level, the level of the first node N1 is adjusted to the level which can turn on the control selection sub-circuit 110 (for example, the first node N1 is charged), thereby turning on the control selection sub-circuit 110. Therefore, the second output terminal OUT2 is connected to the first voltage terminal VGL to receive the first voltage, so that the output of the first output terminal OUT1 of the shift register circuit 200 can be pulled down to output the invalid output level, thereby avoiding the multi-output phenomenon of the first output terminal of the shift register unit.

The first node reset sub-circuit 130 is configured to reset the first node N1 in response to the second reset signal. For example, the first node reset sub-circuit 130 is connected to the second reset terminal RST2, the first node N1, and the first voltage terminal VGL, and is configured to be turned on under control of the second reset signal received by the second reset terminal RST2, so that the first node N1 is electrically connected to the first voltage terminal VGL, so the first node N1 can be reset and the control selection sub-circuit 110 is turned off, thereby the first output terminal OUT1 of the shift register circuit 200 can normally output. For example, the second reset signal may be an output signal of a first output terminal of a front shift register unit cascaded with the shift register unit 10 or a trigger signal of a next frame, so as to ensure that the first output terminal OUT1 of the shift register unit 10 can be out of control of the output control circuit 100 before the next normal output to ensure normal output.

It should be noted that the first voltage terminal VGL can be configured to keep inputting a direct-current (DC) low level signal, for example, the DC low level signal is referred to as the first voltage, and for example, in the embodiments of the present disclosure, the first voltage is the invalid output level output by the first output terminal, which is same as that in the following embodiments and is not described again.

Figure 3:
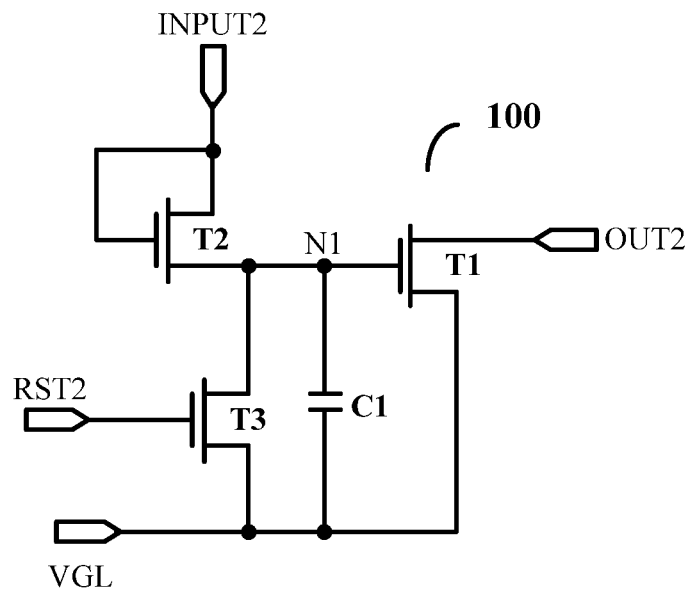
FIG. 3 is a circuit schematic diagram of a specific implementation example of the output control circuit as illustrated in FIG. 2.

For example, the output control circuit 100 as illustrated in FIG. 2 may be implemented as the circuit structure as illustrated in FIG. 3 in an example.

As illustrated in FIG. 3, in this example, the control selection sub-circuit 110 may be implemented as a first transistor T1, for example. A gate electrode of the first transistor T1 is connected to the first node N1 to be turned on under control of the level of the first node N1, a first electrode of the first transistor T1 is connected to the second output terminal OUT2 and is connected to the first output terminal OUT1 of the shift register circuit 200 as well, and a second electrode of the first transistor T1 is connected to the first voltage terminal VGL to receive the first voltage.

The first node control sub-circuit 120 may be implemented as a second transistor T2 and a first storage capacitor C1. A gate electrode of the second transistor T2 and a first electrode of the second transistor T2 are electrically connected to each other and are both configured to be connected to the second input terminal INPUT2, and a second electrode of the second transistor T2 is configured to be connected to the first node N1. A first electrode of the first storage capacitor C1 is connected to the first node N1, and a second electrode of the first storage capacitor C1 is connected to a reference voltage terminal to receive a reference voltage. It should be noted that a voltage input at the reference voltage terminal is referred to as a reference voltage, and the reference voltage can be selected according to needs, such as low level (lower than the first voltage), ground, or high level, as long as it can help the first storage capacitor C1 to realize the function of storing electric charges, which is same as that in the following embodiments and is not described again. For example, as illustrated in FIG. 3, in this embodiment, the reference voltage terminal may also be the first voltage terminal VGL, and the embodiments of the present disclosure are not limited thereto.

The first node reset sub-circuit 130 may be implemented as a third transistor T3. A gate electrode of the third transistor T3 is connected to the second reset terminal RST2, a first electrode of the third transistor T3 is connected to the first node N1, and a second electrode of the third transistor T3 is connected to the first voltage terminal VGL to receive the first voltage.

In the above examples, the first transistor T1, the second transistor T2, and the third transistor T3 are all illustrated by taking N-type transistors as examples, but the embodiments of the present disclosure are not limited thereto and may be implemented at least partially using P-type transistors as required.

Figure 4A:
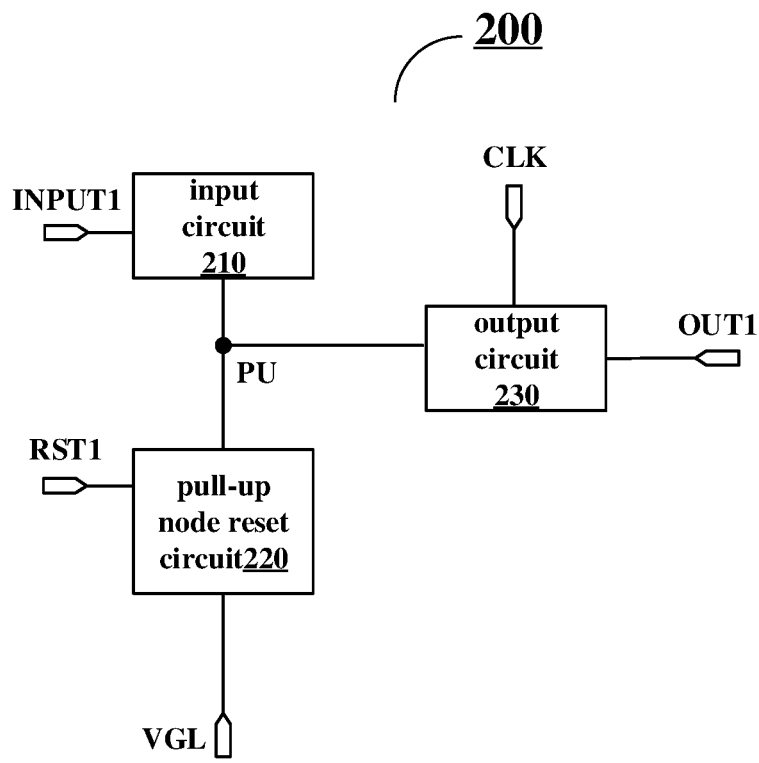
FIG. 4A is a schematic diagram of a shift register circuit according to some embodiments of the present disclosure.

For example, FIG. 4A is a schematic diagram of a shift register circuit 200 according to some embodiments of the present disclosure. As illustrated in FIG. 4A, the shift register circuit 200 includes an input circuit 210, a pull-up node reset circuit 220, and an output circuit 230.

The input circuit 210 is configured to charge a pull-up node PU in response to the first input signal. For example, the input circuit 210 may be connected to the first input terminal INPUT1 and the pull-up node PU, and is configured to electrically connect the pull-up node PU with the first input terminal INPUT1 under control of the first input signal input by the first input terminal INPUT1 or with a high voltage terminal additionally provided, so that the pull-up node PU can be charged by a high level signal input by the first input terminal INPUT1 or a high level signal output by the high voltage terminal, to raise the voltage of the pull-up node PU to control the output circuit 230 to be turned on.

The pull-up node reset circuit 220 is configured to reset the pull-up node PU in response to the first reset signal. For example, the pull-up node reset circuit 220 may be configured to be connected to the first reset terminal RST1, so that the pull-up node PU can be electrically connected to a low level signal or a low voltage terminal which is the first voltage terminal VGL or the reference voltage terminal for example, under control of the first reset signal input by the first reset terminal RST1, thereby pulling down and resetting the pull-up node PU.

The output circuit 230 is configured to output a clock signal input from a clock signal terminal CLK to the first output terminal OUT1 under control of the level of the pull-up node PU, and the signal which is output serves as an output signal of the shift register circuit 200 to be input to the second output terminal OUT2 of the output control circuit 100 connected thereto. For example, the output circuit 230 may be configured to be turned on under control of the level of the pull-up node PU to electrically connect the clock signal terminal CLK with the first output terminal OUT1, so that the clock signal input by the clock signal terminal CLK can be output to the first output terminal OUT1.

Figure 4B:
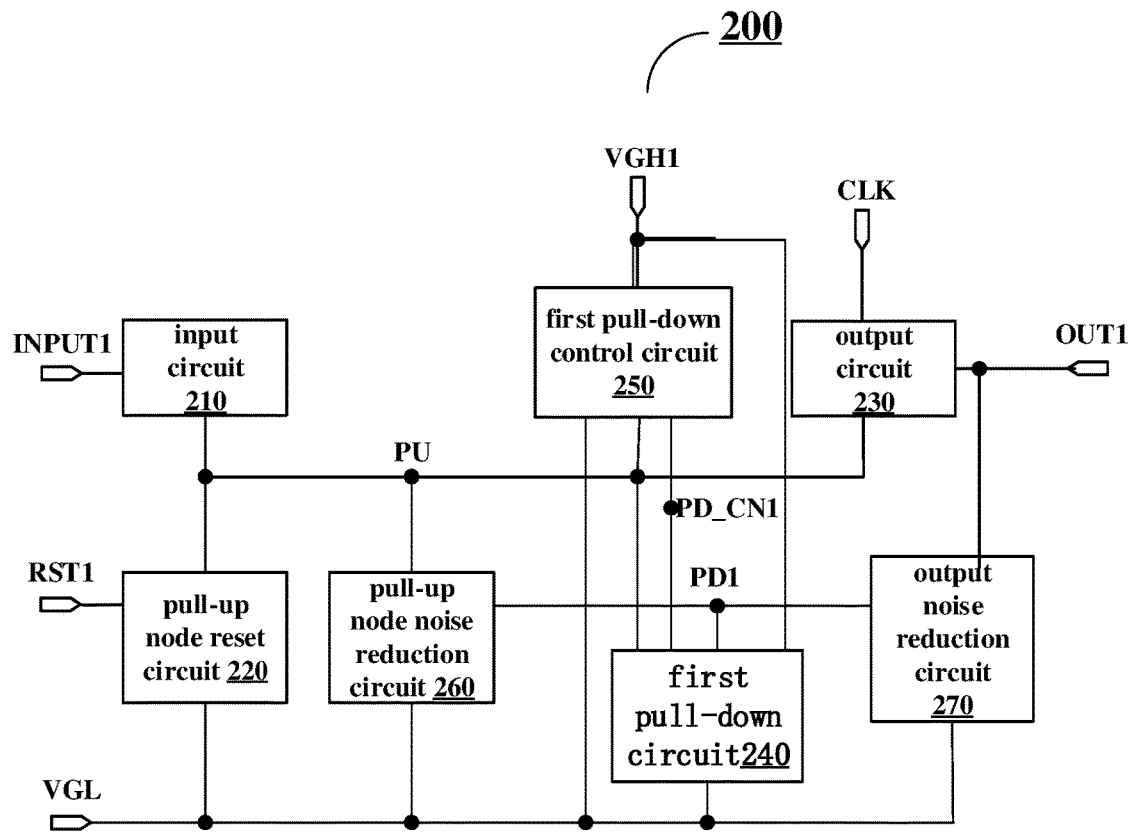
FIG. 4B is a schematic diagram of another shift register circuit according to some embodiments of the present disclosure.

For example, as illustrated in FIG. 4B, in another example of the embodiments of the present disclosure, the shift register circuit 200 may further include a first pull-down circuit 240, a first pull-down control circuit 250, a pull-up node noise reduction circuit 260, and an output noise reduction circuit 270. The input circuit 210, the pull-up node reset circuit 220 and the output circuit 230 in this shift register circuit 200 are similar to that in the shift register circuit 200 described in FIG. 4A, and are not described here again.

The pull-down circuit 240 is configured to control a level of a first pull-down node PD1 under control of levels of the pull-up node PU and a first pull-down control node PD_CN1, thereby controlling the pull-up node noise reduction circuit 260 and the output noise reduction circuit 270.

For example, the first pull-down circuit 240 may be connected to the first voltage terminal VGL, a second voltage terminal VGH1, the pull-up node PU, the first pull-down node PD1, and the first pull-down control node PD_CN1, and can electrically connect the first pull-down node PD1 with the first voltage terminal VGL under control of the level of the pull-up node PU, so as to pull-down and control the level of the first pull-down node PD1 to a low potential. Meanwhile, the first pull-down circuit 240 can electrically connect the first pull-down node PD1 with the second voltage terminal VGH1 under control of the level of the first pull-down control node PD_CN1, thereby charging the first pull-down node PD1 to a high potential.

The first pull-down control circuit 250 is configured to control the level of the first pull-down control node PD_CN1 under control of the level of the pull-up node PU. For example, the first pull-down control circuit 250 may be connected to the first voltage terminal VGL, the second voltage terminal VGH1, the pull-up node PU and the first pull-down control node PD_CN1, and can electrically connect the first pull-down control node PD_CN1 with the first voltage terminal VGL under control of the level of the pull-up node PU, thereby controlling the level of the first pull-down control node PD_CN1.

Figure 4C:
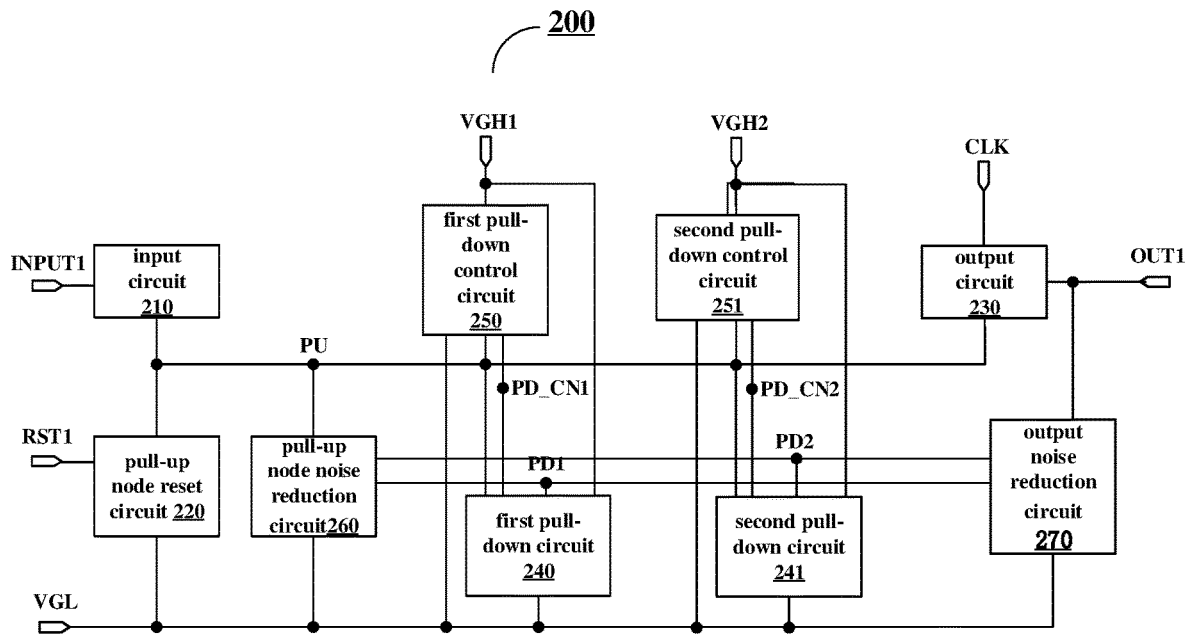
FIG. 4C is a schematic diagram of still another shift register circuit according to some embodiments of the present disclosure.

As illustrated in FIG. 4C, in another example, the shift register circuit 200 may further include a second pull-down circuit 241 and a second pull-down control circuit 251. The input circuit 210, the pull-up node reset circuit 220, the output circuit 230, the first pull-down circuit 240, and the first pull-down control circuit 250 in this shift register circuit 200 are similar to that in the shift register circuit 200 described in FIG. 4A and FIG. 4B, and are not described here again.

The second pull-down circuit 241 is connected to the first voltage terminal VGL, a third voltage terminal VGH2, the pull-up node PU, a second pull-down node PD2, and a second pull-down control node PD_CN2, and can electrically connect the second pull-down node PD2 with the first voltage terminal VGL under control of the level of the pull-up node PU, thereby pulling down and controlling the level of the second pull-down node PD2 to a low potential. Meanwhile, the second pull-down circuit 241 can electrically connect the second pull-down node PD2 with the third voltage terminal VGH2 under control of the level of the second pull-down control node PD_CN2, thereby charging the second pull-down node PD2 to a high potential.

The second pull-down control circuit 251 is configured to control the level of the second pull-down control node PD_CN2 under control of the level of the pull-up node PU. For example, the second pull-down control circuit 251 is connected to the first voltage terminal VGL, the third voltage terminal VGH2, the pull-up node PU and the second pull-down control node PD_CN2, and can electrically connect the second pull-down control node PD_CN2 with the first voltage terminal VGL under control of the level of the pull-up node PU, thereby controlling the level of the second pull-down control node PD_CN2.

The pull-up node noise reduction circuit 260 and the output noise reduction circuit 270 in the shift register unit 200 operate under alternating control of the first pull-down node PD1 and the second pull-down node PD2, and the second voltage terminal VGH1 and the third voltage terminal VHG2 are alternately at high levels, so as to reduce the stress of transistors connected to the second voltage terminal VGH1 and the third voltage terminal VGH2 and prolong the service life of the transistors.

The pull-up node noise reduction circuit 260 is configured to reduce a noise of the pull-up node PU under control of the level of the first pull-down node PD1 or the level of the second pull-down node PD2. For example, the pull-up node noise reduction circuit 260 may be configured to be connected to the first voltage terminal VGL to electrically connect the pull-up node PU with the first voltage terminal VGL under control of the level of the first pull-down node PD1 or the level of the second pull-down node PD2, thereby performing pull-down noise reduction on the pull-up node PU.

The output noise reduction circuit 270 is configured to reduce a noise of the first output terminal OUT1 under control of the level of the first pull-down node PD1 or the level of the second pull-down node PD2. For example, the output noise reduction circuit 270 may be configured to electrically connect the first output terminal OUT1 with the first voltage terminal VGL under control of the level of the first pull-down node PD1 or the level of the second pull-down node PD2, thereby performing pull-down noise reduction on the first output terminal OUT1.

It should be noted that the second voltage terminal VGH1 and the third voltage terminal VGH2 can be configured to alternately input DC high level signals, and for example, the DC high level signal input by the second voltage terminal VGH1 is referred to as a second voltage, and the DC high level signal input by the third voltage terminal VGH2 is referred to as a third voltage. For example, the second voltage and the third voltage can be exactly the same voltage, and the second voltage or the third voltage is greater than the first voltage. The following embodiments are the same as this and are not described again.

Figure 5:
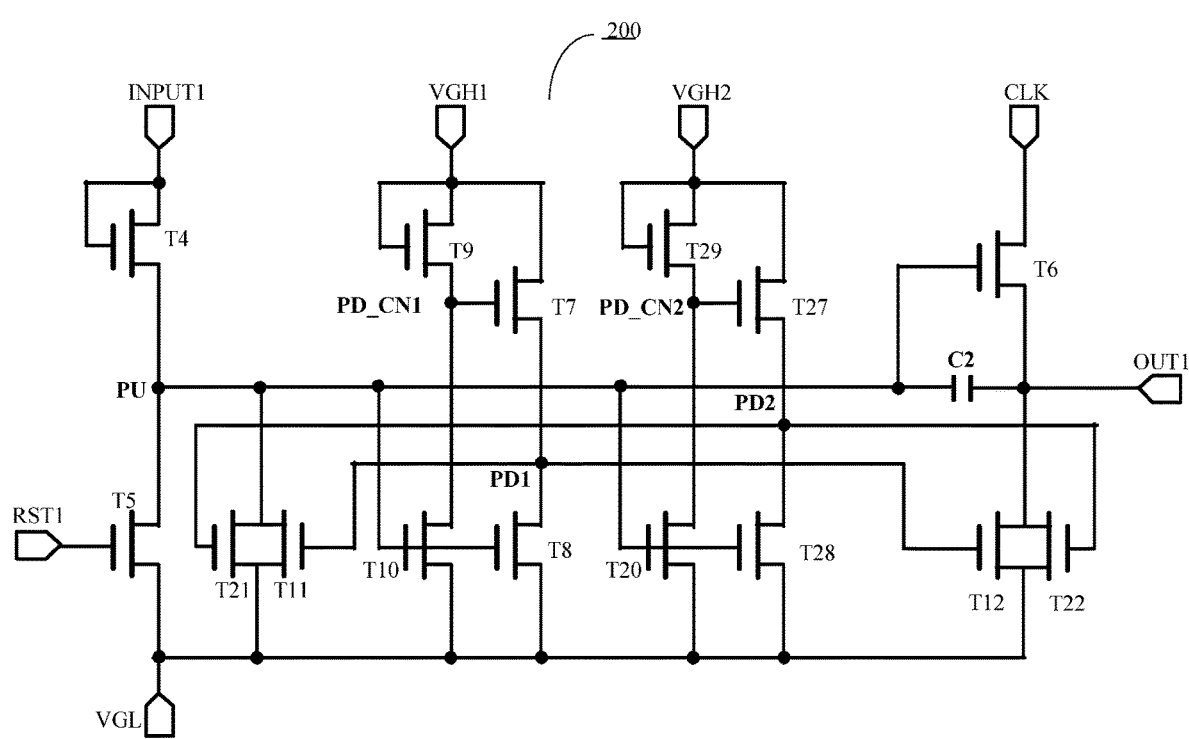
FIG. 5 is a circuit schematic diagram of a specific implementation example of the shift register circuit as illustrated in FIG. 4C.

For example, the shift register circuit 200 as illustrated in FIG. 4C may be implemented as the circuit structure as illustrated in FIG. 5 in an example. In the following description, each transistor is illustrated as an N-type transistor as an example, which is not limitative to the embodiments of the present disclosure.

The input circuit 210 may be implemented as a fourth transistor T4. A gate electrode of the fourth transistor T4 and a first electrode of the fourth transistor T4 are electrically connected to each other and are both configured to be connected to the first input terminal INPUT1 to receive the first input signal, and a second electrode of the fourth transistor T4 is configured to be connected to the pull-up node PU, so that in a case where the first input signal received by the first input terminal INPUT1 is a conductive signal (high level signal), the conductive signal is used by the fourth transistor T4 to charge the pull-up node PU to a high level.

The pull-up node reset circuit 220 may be implemented as a fifth transistor T5. A gate electrode of the fifth transistor T5 is configured to be connected to the first reset terminal RST1 to receive the first reset signal, a first electrode of the fifth transistor T5 is configured to be connected to the pull-up node PU, and a second electrode of the fifth transistor T5 is configured to be connected to the first voltage terminal VGL to receive the first voltage. In a case where the fifth transistor T5 is turned on due to the first reset signal, the pull-up node PU and the first voltage terminal VGL are electrically connected, so that the pull-up node PU can be reset to reduce from a high level to a low level.

The output circuit 230 may be implemented as a sixth transistor T6 and a second storage capacitor C2. A gate electrode of the sixth transistor T6 is configured to be connected to the pull-up node PU, a first electrode of the sixth transistor T6 is configured to be connected to the clock signal terminal CLK to receive the clock signal, and a second electrode of the sixth transistor T6 is configured to be connected to the first output terminal OUT1. A first electrode of the second storage capacitor C2 is configured to be connected to the gate electrode of the sixth transistor T6, and a second electrode of the second storage capacitor C2 is connected to the second electrode of the sixth transistor T6.

The first pull-down circuit 240 may be implemented as a seventh transistor T7 and an eighth transistor T8. A gate electrode of the seventh transistor T7 is configured to be connected to the first pull-down control node PD_CN1, a first electrode of the seventh transistor T7 is configured to be connected to the second voltage terminal VGH1 to receive the second voltage, and a second electrode of the seventh transistor T7 is configured to be connected to the first pull-down node PD1. A gate electrode of the eighth transistor T8 is configured to be connected to the pull-up node PU, a first electrode of the eighth transistor T8 is configured to be connected to the first pull-down node PD1, and a second electrode of the eighth transistor T8 is configured to be connected to the first voltage terminal VGL to receive the first voltage.

The first pull-down control circuit 250 may be implemented as a ninth transistor T9 and a tenth transistor T10. A gate electrode of the ninth transistor T9 and a first electrode of the ninth transistor T9 are electrically connected to each other and are both configured to be connected to the second voltage terminal VGH1 to receive the second voltage, and a second electrode of the ninth transistor T9 is configured to be connected to the first pull-down control node PD_CN1. A gate electrode of the tenth transistor T10 is configured to be connected to the pull-up node PU, a first electrode of the tenth transistor T10 is configured to be connected to the first pull-down control node PD_CN1, and a second electrode of the tenth transistor T10 is configured to be connected to the first voltage terminal VGL to receive the first voltage.

The second pull-down circuit 241 may be implemented as a twenty-seventh transistor T27 and a twenty-eighth transistor T28. A gate electrode of the twenty-seventh transistor T27 is configured to be connected to the second pull-down control node PD_CN2, a first electrode of the twenty-seventh transistor T27 is configured to be connected to the third voltage terminal VGH2 to receive the third voltage, and a second electrode of the twenty-seventh transistor T27 is configured to be connected to the second pull-down node PD2. A gate electrode of the twenty-eighth transistor T28 is configured to be connected to the pull-up node PU, a first electrode of the twenty-eighth transistor T28 is configured to be connected to the second pull-down node PD2, and a second electrode of the twenty-eighth transistor T28 is configured to be connected to the first voltage terminal VGL to receive the first voltage.

The second pull-down control circuit 251 may be implemented as a twenty-ninth transistor T29 and a twentieth transistor T20. A gate electrode of the twenty-ninth transistor T29 and a first electrode of the twenty-ninth transistor T29 are electrically connected to each other and are both configured to be connected to the third voltage terminal VGH2 to receive the third voltage, and a second electrode of the twenty-ninth transistor T29 is configured to be connected to the second pull-down control node PD_CN2. A gate electrode of the twentieth transistor T20 is configured to be connected to the pull-up node PU, a first electrode of the twentieth transistor T20 is configured to be connected to the second pull-down control node PD_CN2, and a second electrode of the twentieth transistor T20 is configured to be connected to the first voltage terminal VGL to receive the first voltage.

The pull-up node noise reduction circuit 260 may be implemented as an eleventh transistor T11 and a twenty-first transistor T21. A gate electrode of the eleventh transistor T11 is configured to be connected to the first pull-down node PD1, a first electrode of the eleventh transistor T11 is configured to be connected to the pull-up node PU, and a second electrode of the eleventh transistor T11 is configured to be connected to the first voltage terminal VGL to receive the first voltage. The eleventh transistor T11 is turned on in a case where the first pull-down node PD1 is at a high potential, and the pull-up node PU is connected to the first voltage terminal VGL, so that the pull-up node PU can be pulled down to realize noise reduction. A gate electrode of the twenty-first transistor T21 is configured to be connected to the second pull-down node PD2, a first electrode of the twenty-first transistor T21 is configured to be connected to the pull-up node PU, and a second electrode of the twenty-first transistor T21 is configured to be connected to the first voltage terminal VGL to receive the first voltage. The twenty-first transistor T21 is turned on in a case where the second pull-down node PD2 is at a high potential, and the pull-up node PU is connected to the first voltage terminal VGL, so that the pull-up node PU can be pulled down to realize noise reduction.

The output noise reduction circuit 270 may be implemented as a twelfth transistor T12 and a twenty-second transistor T22. A gate electrode of the twelfth transistor T12 is configured to be connected to the first pull-down node PD1, a first electrode of the twelfth transistor T12 is configured to be connected to the first output terminal OUT1, and a second electrode of the twelfth transistor T12 is configured to be connected to the first voltage terminal VGL to receive the first voltage. The twelfth transistor T12 is turned on in a case where the first pull-down node PD1 is at a high potential, and the first output terminal OUT1 is connected to the first voltage terminal VGL, so that the noise can be reduced at the first output terminal OUT1. A gate electrode of the twenty-second transistor T22 is configured to be connected to the second pull-down node PD2, a first electrode of the twenty-second transistor T22 is configured to be connected to the first output terminal OUT1, and a second electrode of the twenty-second transistor T22 is configured to be connected to the first voltage terminal VGL to receive the first voltage. The twenty-second transistor T22 is turned on in a case where the second pull-down node PD2 is at a high potential, and the first output terminal OUT1 is connected to the first voltage terminal VGL, so that the noise can be reduced at the first output terminal OUT1.

It should be noted that in the description of various embodiments of the present disclosure, the first node N1, the pull-up node PU, the first pull-down node PD1, the second pull-down node PD2, the first pull-down control node PD_CN1, and the second pull-down control node PD_CN2 do not represent actual components, but represent the junction points of related electrical connections in the circuit diagram.

It should be noted that the transistors used in the embodiments of the present disclosure can be thin film transistors, field effect transistors, or other switching devices with the same characteristics, and the embodiments of the present disclosure are all described with thin film transistors as examples. The source electrode and drain electrode of the transistor used here can be symmetrical in structure, so the source electrode and drain electrode can be structurally indistinguishable. In the embodiments of the present disclosure, in order to distinguish the two electrodes of the transistor except the gate electrode, one electrode is directly described as the first electrode and the other electrode is described as the second electrode.

In addition, the transistors in the embodiments of the present disclosure are all described by taking N-type transistors as examples, in which the first electrode of the transistor is the drain electrode and the second electrode is the source electrode. It should be noted that the present disclosure includes but is not limited to this. For example, one or more transistors in the shift register unit provided by the embodiments of the present disclosure may also adopt P-type transistors. In this case, the first electrode of the transistor is the source electrode and the second electrode is the drain electrode, as long as the polarities of the respective electrodes of the selected type of transistors are correspondingly connected according to the polarities of the respective electrodes of the respective transistors in the embodiments of the present disclosure, and the respective voltage terminals provide corresponding high voltages or low voltages. In a case where N-type transistors are used, indium gallium zinc oxide (IGZO) can be used as an active layer of the thin film transistor. Compared with cases where low temperature polysilicon (LTPS) or amorphous silicon (such as hydrogenated amorphous silicon) is used as the active layer of the thin film transistor, the size of the transistor can be effectively reduced and leakage current can be prevented.

In the embodiments of the present disclosure, for example, in a case where each circuit is implemented as an N-type transistor, the term "pull-up" means charging a node or an electrode of a transistor so as to raise the absolute value of the level of the node or the electrode, thereby realizing the operation (e.g., turn-on) of the corresponding transistor; and the term "pull-down" means discharging a node or an electrode of a transistor so as to reduce the absolute value of the level of the node or the electrode, thereby realizing the operation (e.g., turn-off) of the corresponding transistor. For another example, in a case where each circuit is implemented as a P-type transistor, the term "pull-up" means discharging a node or an electrode of a transistor so as to reduce the absolute value of the level of the node or the electrode, thereby realizing the operation (e.g., turn-on) of the corresponding transistor; and the term "pull-down" means charging a node or an electrode of a transistor so as to raise the absolute value of the level of the node or the electrode, thereby realizing the operation (e.g., turn-off) of the corresponding transistor.

For example, as illustrated in FIG. 5, the transistors in the shift register circuit 200 are all N-type transistors. The first voltage terminal VGL maintains inputting a first voltage of DC low level, the second voltage terminal VGH1 and the third voltage terminal VGH2 alternately input a second voltage and a third voltage of DC high level, and the clock signal terminal CLK inputs a clock signal.

Figure 6:
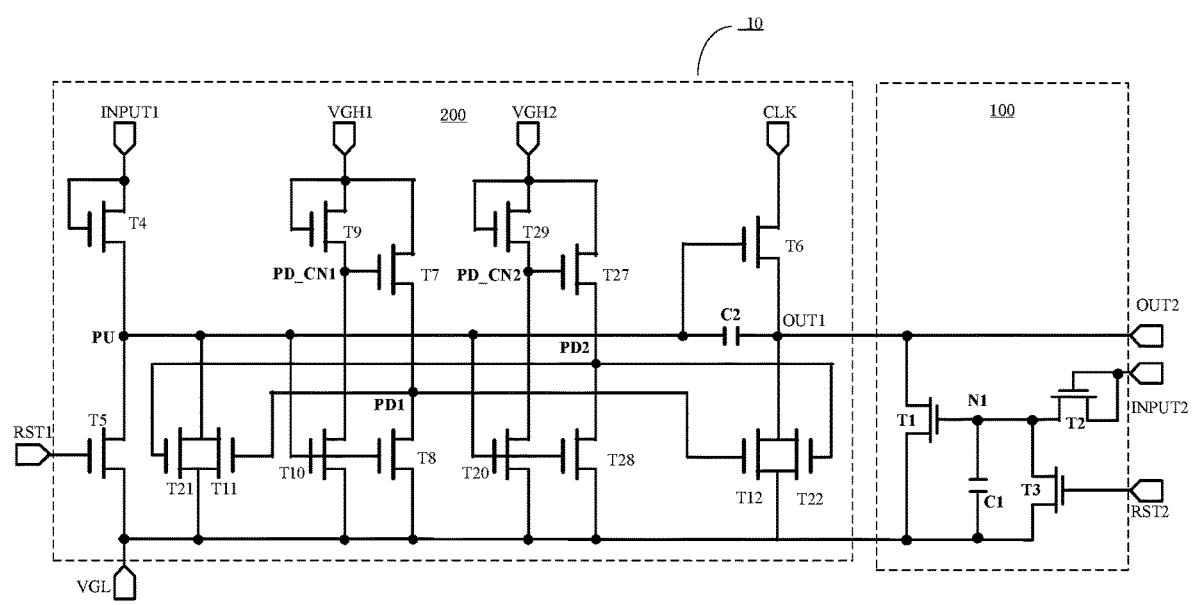
FIG. 6 is a circuit schematic diagram of a specific implementation example of the shift register unit as illustrated in FIG. 1.

FIG. 6 is a circuit schematic diagram of a specific implementation example of the shift register unit as illustrated in FIG. 1. As illustrated in FIG. 6, the shift register unit 10 includes an output control circuit 100 and a shift register circuit 200. For example, the output control circuit 100 adopts a circuit structure as illustrated in FIG. 3, and the shift register circuit 200 adopts a circuit structure as illustrated in FIG. 5. The connection relationship between the output control circuit 100 and the shift register circuit 200 is illustrated in FIG. 6, and the first output terminal OUT1 and the second output terminal OUT2 are electrically connected to each other.

It should be noted that the shift register circuit 200 in the embodiments of the present disclosure is not limited to the examples described above, and any shift register circuit that can be cascaded to form a gate drive circuit to output multi-level scanning signals can be applied in the embodiments of the present disclosure.

The embodiments of the present disclosure provide a gate drive circuit 20, which includes a plurality of shift register units 10 that are cascaded. For example, each shift register unit 10 is described taking the circuit structure illustrated in FIG. 6 as an example, but the embodiments of the present disclosure are not limited thereto.

The gate drive circuit 20 further includes 2m (m is an integer greater than 0) clock signal lines which are configured to supply clock signals to each shift register unit. For example, the gate drive circuit 20 illustrated in FIG. 7A or FIG. 8A includes two clock signal lines, therefore, in this case, m is equal to 1; and the gate drive circuit 20 illustrated in FIG. 9A includes four clock signal lines, therefore, in this case, m is equal to 2.

Figure 7A:
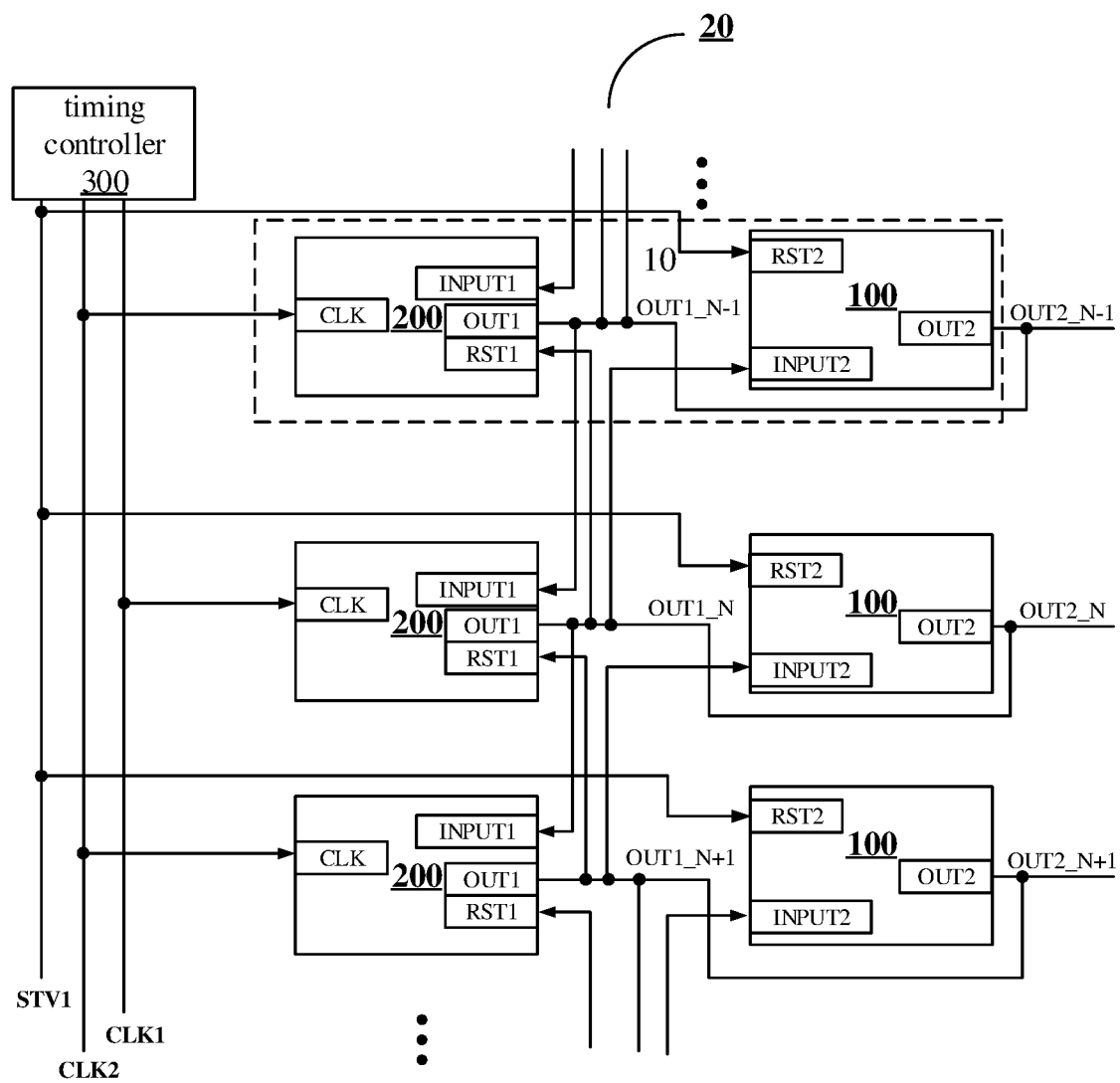
FIG. 7A is a schematic diagram of a gate drive circuit according to some embodiments of the present disclosure.
Figure 8A:
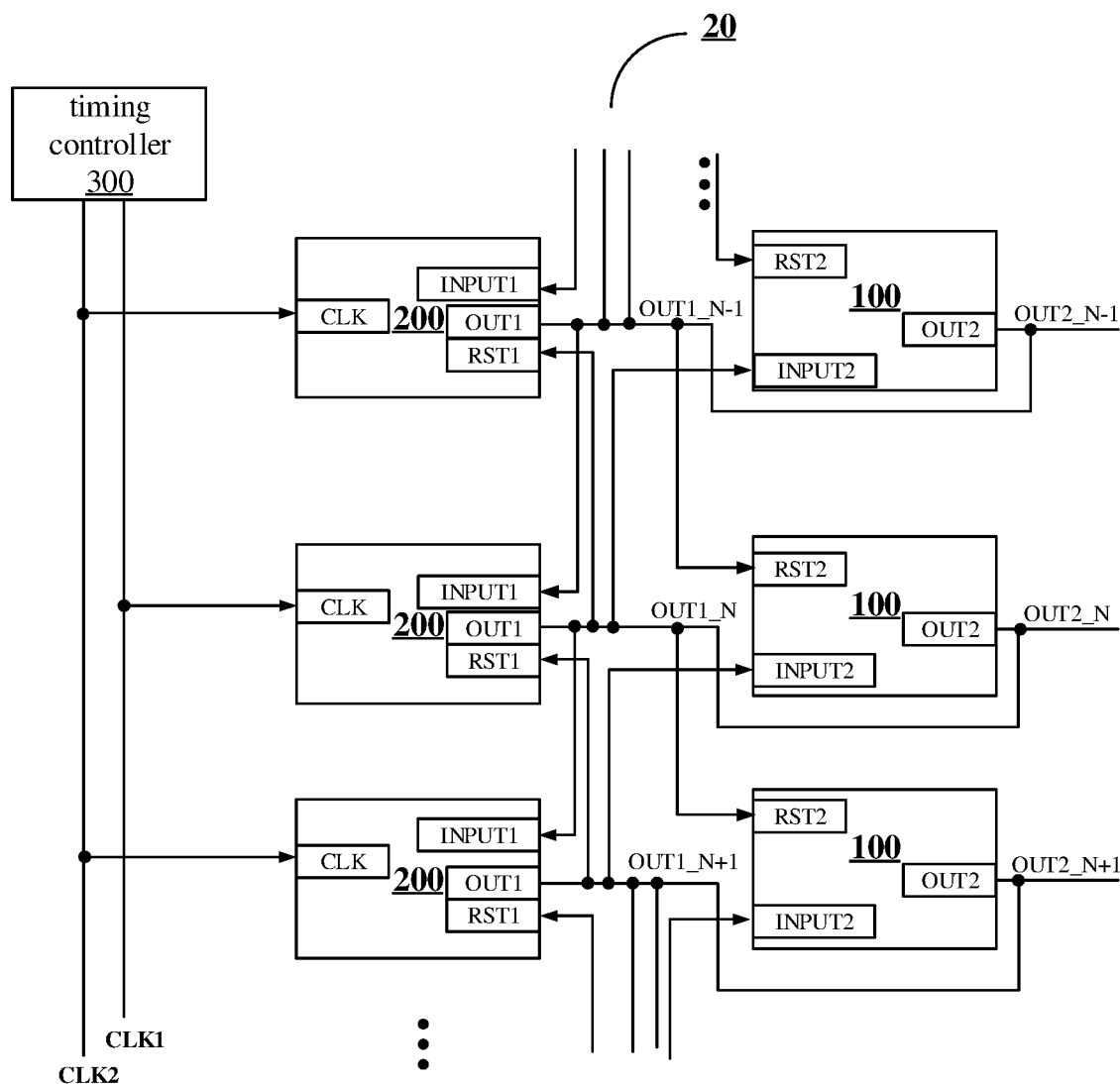
FIG. 8A is a schematic diagram of another gate drive circuit according to some embodiments of the present disclosure.
Figure 9A:
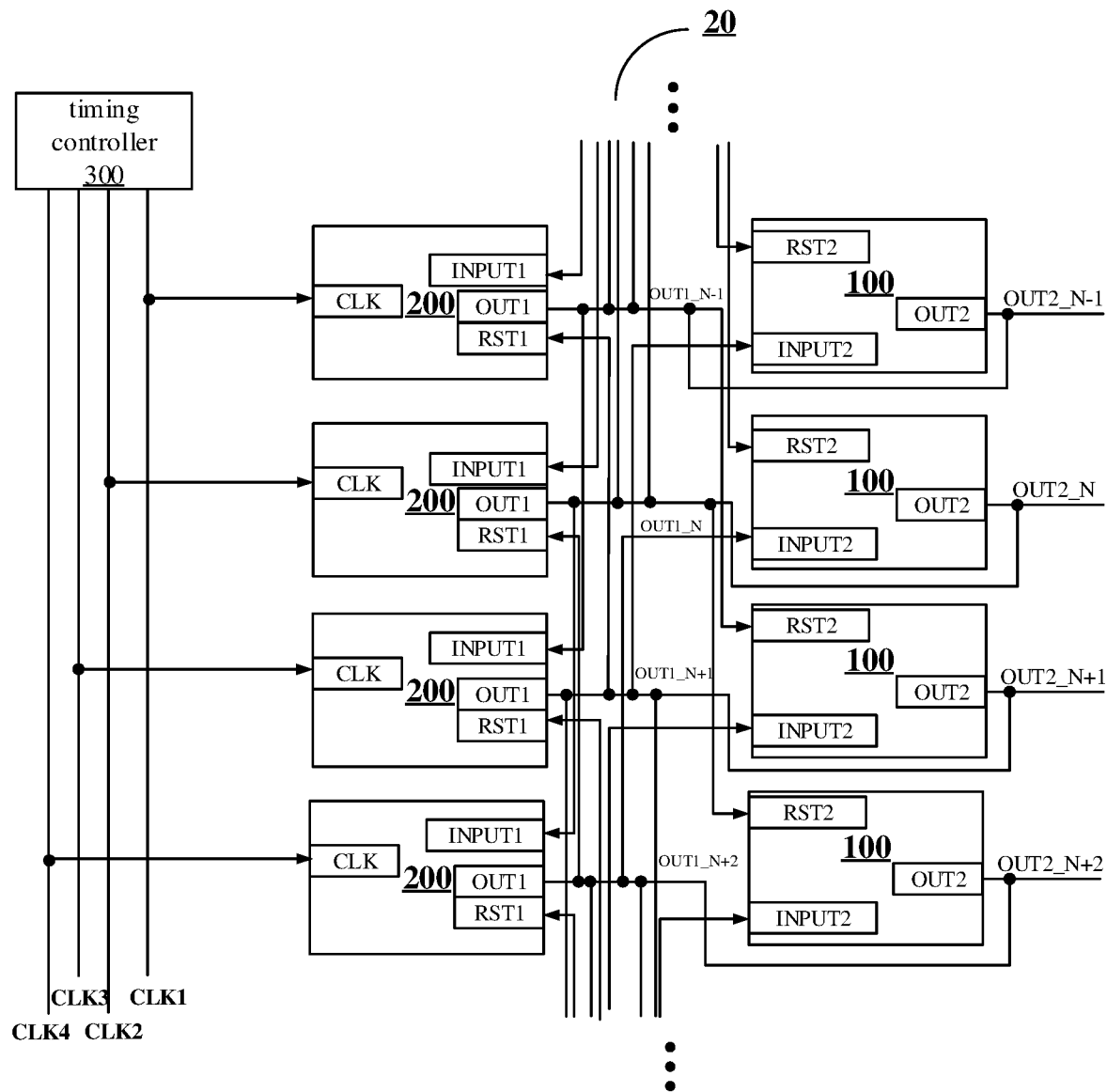
FIG. 9A is a schematic diagram of still another gate drive circuit according to some embodiments of the present disclosure.

In the gate drive circuit 20, except for last m shift register units, a second input terminal INPUT2 of other shift register units is connected to a first output terminal OUT1 of a hind shift register unit which is separated by m−1 shift register units. For example, as illustrated in FIG. 7A or FIG. 8A, in the case where two clock signal lines are included, that is, in a case where m is 1, m−1 is 0, i.e., the two shift register units are closely adjacent. For example, in the gate drive circuit 20 as illustrated in FIG. 7A or FIG. 8A, except for the last shift register unit, a second input terminal INPUT2 of other shift register units is connected to a first output terminal OUT1 of a hinder shift register unit, that is, connected to the first output terminal OUT1 of the hinder shift register unit which is separated by 0 shift register unit. For example, as illustrated in FIG. 9A, in the case where four clock signal lines are included, i.e., m is equal to 2, the gate drive circuit 20 is connected in such a way that, except for the last two shift register units, a second input terminal INPUT2 of other shift register units is connected to a first output terminal OUT1 of a hind shift register unit which is separated by one shift register unit.

For example, for the second input terminals INPUT2 of the last m shift register units, input signals may be separately supplied thereto, or they may be sequentially connected to the first output terminals OUT1 of the first to mth shift register units. For example, in the gate drive circuit 20 illustrated in FIG. 7A or FIG. 8A, a second input signal may be separately provided to the second input terminal INPUT2 of the last shift register unit, or the second input terminal INPUT2 of the last shift register unit may be connected to the first output terminal OUT1 of the first shift register unit. For example, in the gate drive circuit 20 illustrated in FIG. 9A, second input signals may be separately provided to the second input terminals INPUT2 of the last two shift register units, or the second input terminals INPUT2 of the last two shift register units may be sequentially connected to the first output terminals OUT1 of the first to second shift register units, and for example, the second input terminal INPUT2 of the last shift register unit is connected to the first output terminal OUT1 of the second shift register unit, and the second input terminal INPUT2 of the last second shift register unit is connected to the first output terminal OUT1 of the first shift register unit.

Except for the first shift register unit (in the case where m=1, i.e., two clock signal lines are included) or the first to the mth shift register units (in a case where m is greater than 1), the first input terminal INPUT1 of each of other register units is connected to the first output terminal OUT1 of a front shift register unit which is separated by m−1 shift register units, and first input signals can be separately provided for the first input terminals INPUT1 of the first to mth shift register units. Alternatively, the first input terminals INPUT1 of the first to mth shift register units can be connected to the first output terminals OUT1 of the last m shift register units in sequence. For example, the connection mode of the first or the first to mth shift register units is same as that of the second reset terminal RST2 of the same shift register units, which is described in detail below. Except for the last m shift register units, the first reset terminal RST1 of each of the other shift register units is connected to the first output terminal OUT1 of the hind shift register unit which is separated by m−1 shift register units. The first reset terminals RST1 of the last m shift register units may be separately provided with reset signals (e.g., same as the second input signal of the second input terminal INPUT2 of the same shift register unit), or the first reset terminals RST1 of the last m shift register units may be sequentially connected to the first output terminals OUT1 of the first to mth shift register units, e.g., the connection mode thereof is same as the connection mode of the second input terminal INPUT2 of the same shift register unit, and is not repeated here.

The second reset terminal RST2 of the output control circuit 100 of each shift register unit is connected to a trigger signal line STV1, for example, as illustrated in FIG. 7A. Alternatively, except for the first (in the case where m=1, i.e., two clock signal lines are included) or the first to the mth shift register units (in the case where m is greater than 1), the second reset terminal RST2 of the output control circuit 100 of each of the other shift register units is connected to the first output terminal OUT1 of the front shift register unit which is separated by m−1 shift register units. For example, the second reset signals may be separately provided for the second reset terminals RST2 of the first to mth shift register units (e.g., same as the signal of the first input terminal INPUT1 of the same shift register unit), or the second reset terminals RST2 of the first to mth shift register units may be connected in sequence to the first output terminals OUT1 of the last m shift register units. For example, as illustrated in FIG. 8A, this example includes two clock signal lines, i.e., m is equal to 1. In the gate drive circuit 20, except for the first shift register unit, the second reset terminal RST2 of the output control circuit 100 of each of the other shift register units is connected to the first output terminal OUT1 of the adjacent front shift register unit, i.e., connected to the first output terminal OUT1 of the front shift register unit which is separated by 0 shift register unit. For example, the second reset signal may be separately provided to the second reset terminal RST2 of the first shift register unit (e.g., same as the signal of the first input terminal INPUT1 of the same shift register unit), or the second reset terminal RST2 of the first shift register unit may be connected to the first output terminal OUT1 of the last shift register unit. For example, as illustrated in FIG. 9A, except for the first and second shift register units, the second reset terminal RST2 of the output control circuit 100 of each of the other shift register units is connected to the first output terminal OUT1 of the front shift register unit which is separated by one shift register unit. For example, the second reset signals may be separately provided for the second reset terminals RST2 of the first and second shift register units (e.g., same as that the signal of the first input terminal INPUT1 of the same shift register unit), or the second reset terminals RST2 of the first and second shift register units are connected to the first output terminals OUT1 of the last two shift register units in sequence, and for example, the second reset terminal RST2 of the first shift register unit is connected to the first output terminal OUT1 of the last second shift register unit, and the second reset terminal RST2 of the second shift register unit is connected to the first output terminal OUT1 of the last shift register unit.

For example, as illustrated in FIG. 7A, an example of the embodiments of the present disclosure provides a gate drive circuit 20, which includes a plurality of shift register units 10 that are cascaded, a first clock signal line CLK1, a second clock signal line CLK2, and a trigger signal line STV1. For example, each shift register unit 10 adopts the circuit structure as illustrated in FIG. 6. It should be noted that the gate drive circuit 20 may further include four, six or eight clock signal lines, the number of which depends on the specific situations, and the embodiments of the present disclosure are not limited thereto.

For example, as illustrated in FIG. 7A, each of the shift register units further includes a clock signal terminal CLK and is configured to be connected to the first clock signal line CLK1 or the second clock signal line CLK2 to receive a first clock signal or a second clock signal. The first clock signal line CLK1 is connected to clock signal terminals CLK of (2n−1)th (n is an integer greater than 0) shift register units, and the second clock signal line CLK2 is connected to clock signal terminals CLK of (2n)th shift register units. It should be noted that the embodiments of the present disclosure include but are not limited to the above-mentioned connection mode. For example, the first clock signal line CLK1 may be connected to the clock signal terminals CLK of the (2n)th (n is an integer greater than 0) shift register units, and the second clock signal line CLK2 may be connected to the clock signal terminals CLK of the (2n−1)th shift register units.

It should be noted that OUT1_N−1 illustrated in FIG. 7A represents a first output terminal of (N−1)th shift register unit, OUT1_N represents a first output terminal of Nth shift register unit, OUT1_N+1 represents a first output terminal of (N+1)th shift register unit, and so on. OUT2_N−1 illustrated in FIG. 7A represents a second output terminal of an output control circuit of the (N−1)th shift register unit, OUT2_N represents a second output terminal of an output control circuit of the Nth shift register unit, OUT2_N+1 represents a second output terminal of an output control circuit of the (N+1)th shift register unit, and so on. The reference numerals in the following embodiments are similar to this and are not repeated again.

For example, as illustrated in FIG. 7A, the gate drive circuit 20 may further include a timing controller 300. For example, the timing controller 300 may be configured to be connected to the trigger signal line STV1, the first clock signal line CLK1, and the second clock signal line CLK2, to provide trigger signals and clock signals to each shift register unit. For example, the timing controller 300 may also be configured to provide reset signals.

For example, as illustrated in FIG. 7A or FIG. 8A, except for the last shift register unit, the second input terminal INPUT2 of each of the other shift register units is connected to the first output terminal OUT1 of the adjacent hind shift register unit. For example, the second input terminal INPUT2 of the last shift register unit may be separately provided with an input signal, or the second input terminal INPUT2 of the last shift register unit may be connected to the first output terminal OUT1 of the first shift register unit. Except for the last shift register unit, the first reset terminal RST1 of each of the other shift register units is connected to the first output terminal OUT1 of the adjacent hind shift register unit. Except for the first shift register unit, the first input terminal INPUT1 of each of the other shift register units is connected to the first output terminal OUT1 of the adjacent front shift register unit. For example, as illustrated in FIG. 7A, the second reset terminal RST2 of the output control circuit 100 of each shift register unit is connected to the trigger signal line STV1 to receive the trigger signal, so as to simultaneously reset the first node N1 of the output control circuit 100 of each shift register unit when a frame starts scanning, thus ensuring that the Nth shift register unit resets the first node N1 of the Nth shift register unit in response to the second reset signal before the first output terminal OUT1 of the shift register circuit 200 of the Nth shift register unit enters the period when the valid output level is output, thereby not affecting the normal output of each shift register circuit. For example, in this example, the second reset signal is the trigger signal.

For example, the first input INPUT1 of the first shift register unit may be connected to the trigger signal line STV1 and configured to receive the trigger signal STV, or be connected to the first output OUT1 of the last shift register unit. The first reset terminal RST1 of the last shift register unit may be configured to receive a separately provided first reset signal RESET1 (e.g., same as the signal of the second input terminal INPUT2 of the same shift register unit), or be connected to the first output terminal OUT1 of the first shift register unit, which is not illustrated in FIG. 7A for the sake of brevity.

It should be noted that in the embodiments of the present disclosure, that a shift register unit B is a hind shift register unit of another shift register unit A, indicates that a gate scanning signal output by the shift register unit B is later in timing than a gate scanning signal output by the shift register unit A. Correspondingly, that a shift register unit B is a front shift register unit of another shift register unit A, indicates that a gate scanning signal output by the shift register unit B is earlier in timing than a gate scanning signal output by the shift register unit A. The following embodiments are the same as this and are not described again.

Figure 7B:
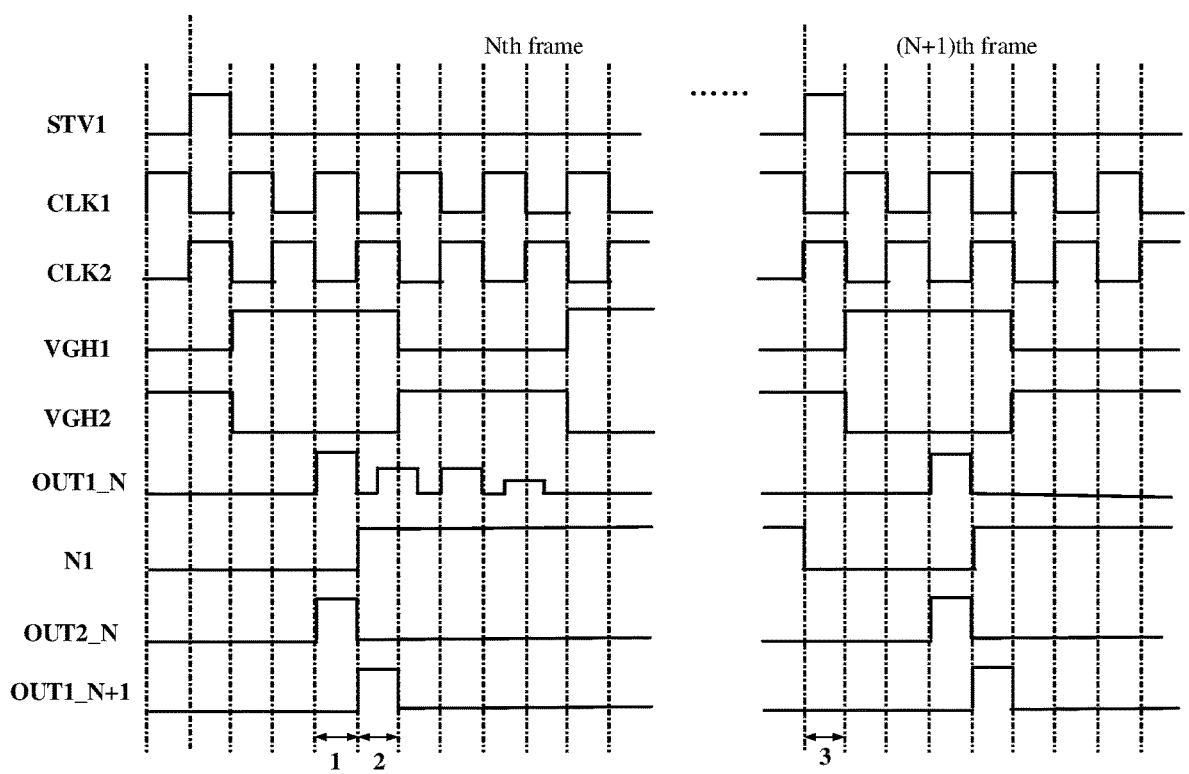
FIG. 7B is a signal timing diagram corresponding to the operation of the gate drive circuit as illustrated in FIG. 7A.

For example, the clock signal timing provided by the trigger signal line STV1, the first clock signal line CLK1, and the second clock signal line CLK2 may adopt the signal timing illustrated in FIG. 7B, to realize the function of outputting gate scanning signals row by row by the gate drive circuit 20.

The operation principle of the gate drive circuit 20 as illustrated in FIG. 7A is described below with reference to the signal timing as illustrated in FIG. 7B. Here, STV1, CLK1, CLK2, VGH1, VGH2, OUT1_N, N1, OUT2_N and OUT1_N+1 represent not only corresponding signal terminals or signal lines, but also corresponding signals. The following embodiments are the same as above and are not described again. In FIG. 7B, the valid output level is a high level and the invalid output level is a low level. The first clock signal CLK1 and the second clock signal CLK2 are complementary to each other.

In three phases of a first phase 1, a second phase 2, and a third phase 3 as illustrated in FIG. 7B, the gate drive circuit 20 can perform following operations respectively. For example, the embodiments of the present disclosure take the working principle of the Nth shift register unit in the gate drive circuit 20 as an example, and the working principle of the other shift register units is the same and is not described again. For example, the Nth shift register unit includes an Nth shift register circuit and an Nth output control circuit.

It should be noted that, as illustrated in FIG. 7B, in this example, an Nth frame is a phase of outputting the gate scanning signals row by row, and an (N+1)th frame is a phase of outputting the gate scanning signals row by row next to the Nth frame.

Figure 7C:
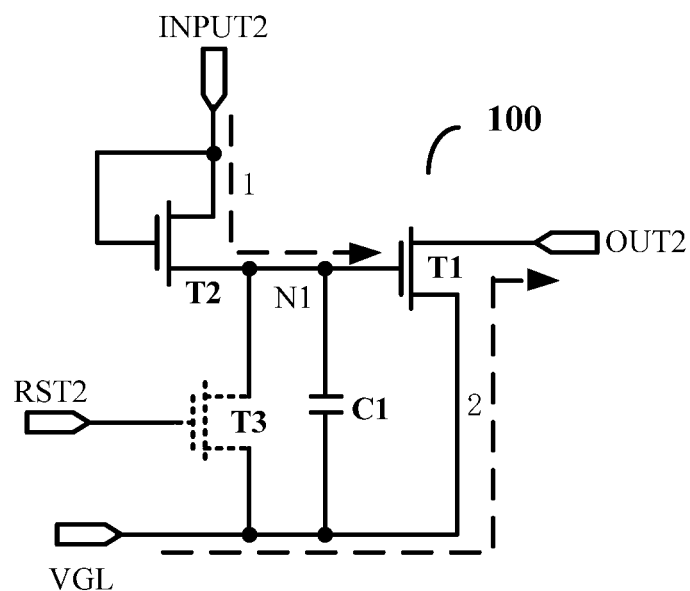
FIG. 7C and FIG. 7D are circuit schematic diagrams of the output control circuit as illustrated in FIG. 3 corresponding to the gate drive circuit in FIG. 7A.
Figure 7D:
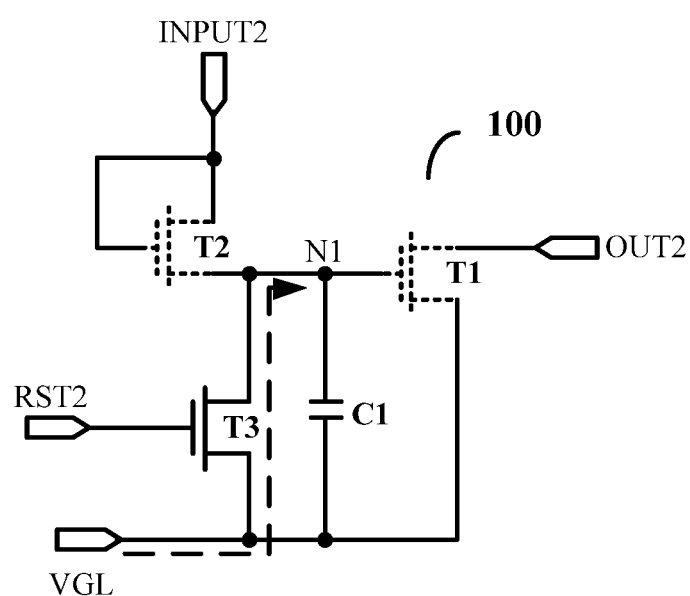

It should be noted that FIG. 7C is a schematic diagram in a case where the output control circuit 100 as illustrated in FIG. 3 is in the second phase 2, and FIG. 7D is a schematic diagram in a case where the output control circuit 100 as illustrated in FIG. 3 is in the third phase 3. In addition, transistors identified by dashed lines in FIG. 7C and FIG. 7D both indicate that they are in a turn-off state in the corresponding phases, and dashed lines with arrows in FIG. 7C and FIG. 7D indicate the current direction of the output control circuit 100 in the corresponding phases. The transistors as illustrated in FIG. 7C and FIG. 7D are explained by taking N-type transistors as an example, i.e., the gate electrode of each transistor is turned on when a high level is provided, and is turned off when a low level is provided.

In the first phase 1, the trigger signal line STV1 provides a low level signal, and the first clock signal line CLK1 provides a high level signal. Because the clock signal terminal CLK of the Nth shift register unit is connected to the first clock signal line CLK1, the high level signal input by the clock signal terminal CLK is output to the first output terminal OUT1_N of the Nth shift register unit during this phase. For example, the high level is referred to as a valid output level, that is, the first output terminal OUT1 of the Nth shift register unit is in a period when the valid output level is output during this phase. At this time, the second clock signal line CLK2 provides a low level signal. Because the clock signal terminal CLK of the (N+1)th shift register unit is connected to the second clock signal line CLK2, the low level signal input by the clock signal terminal CLK during this phase is output to the first output terminal OUT1_N+1 of the (N+1)th shift register unit. Because the second input terminal INPUT2 of the Nth output control circuit 100 is connected to the first output terminal OUT1_N+1 of the (N+1)th shift register unit, the output control circuit 100 is in a turn-off state during this phase, and because the second output terminal OUT2_N of the output control circuit 100 of the Nth shift register unit is connected to the first output terminal OUT1_N of the shift register circuit 200 of the Nth shift register unit, the second output terminal OUT2_N of the output control circuit 100 of the Nth shift register unit outputs a high level signal during this phase. It should be noted that the level of potential in the signal timing as illustrated in FIG. 7B is only schematic and does not represent the true potential value or relative proportion. Corresponding to the above examples, the high level signal corresponds to the turn-on signal of the N-type transistor, while the low level signal corresponds to the turn-off signal of the N-type transistor.

In the second phase 2, the trigger signal line STV1 provides a low level signal and the first clock signal line CLK1 provides a low level signal. Because the clock signal terminal CLK of the Nth shift register unit is connected to the first clock signal line CLK1, the low level signal input by the clock signal terminal CLK is output to the first output terminal OUT1_N of the Nth shift register unit during this phase. For example, the low level is referred to as an invalid output level, that is, the first output terminal OUT1 of the Nth shift register unit is in a period when the invalid output level is output during this phase. At this time, the second clock signal line CLK2 provides a high level signal. Because the clock signal terminal CLK of the (N+1)th shift register unit is connected to the second clock signal line CLK2, the high level signal input by the clock signal terminal CLK is output to the first output terminal OUT1_N+1 of the (N+1)th shift register unit during this phase. Therefore, during this phase, the first output terminal OUT1 of the (N+1)th shift register unit is in a period when the valid output level is output.

As illustrated in FIG. 7B and FIG. 7C, because the second input terminal INPUT2 of the Nth output control circuit 100 is connected to the first output terminal OUT1_N+1 of the (N+1)th shift register unit, the second input terminal INPUT2 of the Nth output control circuit 100 receives a high level signal. In this phase, the second transistor T2 is turned on in response to the input high level signal received by the second input terminal INPUT2, the first transistor T1 is turned on in response to the high level of the first node N1, and meanwhile, the third transistor T3 is turned off in response to the low level of the trigger signal.

As illustrated in FIG. 7C, in the second phase 2, a charging path of the first node N1 (as illustrated by the dashed line 1 with an arrow in FIG. 7C) and an output path of the invalid output level of the second output terminal OUT2 (as illustrated by the dashed line 2 with an arrow in FIG. 7C) are formed in the output control circuit 100 as illustrated in FIG. 3. Because the second transistor T2 is turned on, the valid output level of the first output terminal OUT1_N+1 of the (N+1)th shift register unit received at the second input terminal INPUT2 charges the first node N1 to a high level. The first transistor T1 is turned on under control of the high level of the first node N1, so that the second output terminal OUT2 of the output control circuit 100 of the Nth shift register unit is connected to the first voltage terminal VGL, thus the second output terminal OUT2 outputs a first voltage, i.e., outputs the invalid output level. Because in the Nth shift register unit, the second output terminal OUT2_N is connected to the first output terminal OUT1_N, the output of the first output terminal OUT1_N of the shift register circuit 200 of the Nth shift register unit is also pulled down to output the invalid output level, and therefore, the first output terminal OUT1_N of the Nth shift register unit enters a period when the valid output level is output.

In the third phase 3, the (N+1)th frame starts scanning, while the first output terminal OUT1_N of the shift register circuit 200 of the Nth shift register unit is still in the period when the invalid output level is output. The trigger signal line STV1 provides a high level signal. Because the second reset terminal RST2 of the Nth output control circuit 100 is connected to the trigger signal line STV1, the first node reset sub-circuits 130 of the output control circuits 100 of all shift register units are turned on during this phase.

As illustrated in FIG. 7D, in the third phase 3, the third transistor T3 is turned on in response to the second reset signal (i.e., the trigger signal) received by the second reset terminal RST2, the first transistor T1 is turned off under control of the low level of the first node N1, and the second transistor T2 is turned off under control of the second input signal input by the second input terminal INPUT2.

As illustrated in FIG. 7D, in the third phase 3, a reset path of the first node N1 (as illustrated by the dashed line with an arrow in FIG. 7D) is formed in the output control circuit 100 as illustrated in FIG. 3. Because the third transistor T3 is turned on, the first node N1 is connected to the first voltage terminal VGL, and the first node N1 is discharged to the first voltage (low level). At this time, both the first electrode and the second electrode of the first storage capacitor C1 are connected to the first voltage terminal VGL, so the first storage capacitor C1 is discharged and continues to stabilize the voltage of the first node N1, so that the first transistor T1 is turned off under control of the level of the first node N1, so as to close the control on the first output terminal OUT1 of the shift register unit and ensure that the first output terminal OUT1 of each shift register unit can normally output the valid output level during the (N+1)th frame scanning.

FIG. 8A is another example of a gate drive circuit 20 provided by some embodiments of the present disclosure. The gate drive circuit 20 as illustrated in FIG. 8A is similar in structure to the gate drive circuit 20 as illustrated in FIG. 7A, except followings: in the gate drive circuit 20, except for the first output control circuit 100, the second reset terminal RST2 of each of the other output control circuits 100 is connected to the first output terminal OUT1 of the adjacent front shift register unit; the second reset terminal RST2 of the output control circuit 100 of the first shift register unit can be configured to receive a second reset signal RESET2 that is separately provided or be connected to the first output terminal OUT1 of the last shift register unit, thereby ensuring that the Nth shift register unit resets the first node N1 of the Nth shift register unit in response to the second reset signal before the first output terminal OUT1 of the shift register circuit 200 of the Nth shift register unit enters the period when the valid output level is output. In this example, the second reset signal is the output signal of the first output terminal OUT1 of the adjacent front shift register unit. It should be noted that the trigger signal line STV1 and the second reset signal RESET2 are not illustrated in FIG. 8A for the sake of brevity.

Figure 8B:
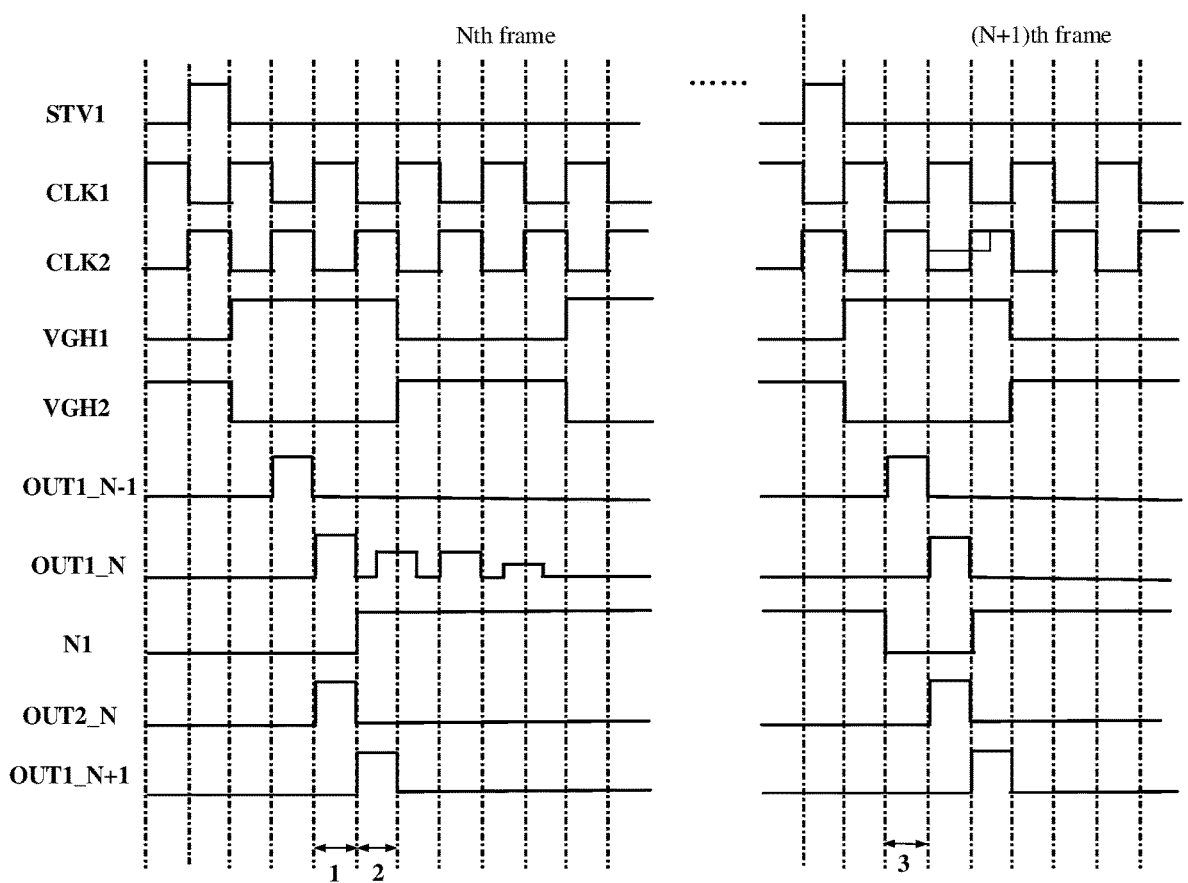
FIG. 8B is a signal timing diagram corresponding to the operation of the gate drive circuit as illustrated in FIG. 8A.

For example, the timing of the trigger signal and the clock signals provided by the trigger signal line STV1, the first clock signal line CLK1, and the second clock signal line CLK2 may adopt the signal timing as illustrated in FIG. 8B, to realize the function of outputting gate scanning signals row by row by the gate drive circuit 20.

The operation principle of the gate drive circuit 20 as illustrated in FIG. 8A is described below with reference to the signal timing as illustrated in FIG. 8B. In FIG. 8B, the valid output level is a high level and the invalid output level is a low level. The first clock signal CLK1 and the second clock signal CLK2 are complementary to each other.

In three phases of a first phase 1, a second phase 2 and a third phase 3 as illustrated in FIG. 8B, the gate drive circuit 20 can perform following operations respectively. As illustrated in FIG. 8B, the operation principle of the gate drive circuit 20 illustrated in FIG. 8A is similar to that of the gate drive circuit illustrated in FIG. 7A, except for the third phase 3. Therefore, similar parts are not described in detail, and the specific operation process of the gate drive circuit 20 during the third phase 3 is described below.

In the third phase 3, the second clock signal line CLK2 provides a high level signal. Because the clock signal terminal CLK of the (N−1)th shift register unit is connected to the second clock signal line CLK2, the high level signal input by the clock signal terminal CLK is output to the first output terminal OUT1_N−1 of the (N−1)th shift register unit during this phase. Therefore, in this phase, the first output terminal OUT1_N−1 of the (N−1)th shift register unit is in a period when the valid output level is output. Because the second reset terminal of the output control circuit of the Nth shift register unit is connected to the first output terminal OUT1_N−1 of the (N−1)th shift register unit, the first node reset sub-circuit of the output control circuit of the Nth shift register unit is turned on during this phase to reset the first node, thus not affecting the normal output of the Nth shift register circuit cascaded with the (N−1)th shift register unit.

In this phase, the operation principle of the output control circuit is similar to that of the circuit diagram illustrated in FIG. 7D, and is not repeated here.

An embodiment of the present disclosure also provides a gate drive circuit 20. As illustrated in FIG. 9A, the gate drive circuit 20 includes a plurality of shift register units 10 that are cascaded, a first clock signal line CLK1, a second clock signal line CLK2, a third clock signal line CLK3, and a fourth clock signal line CLK4. For example, each shift register unit 10 adopts the circuit structure as illustrated in FIG. 6.

For example, as illustrated in FIG. 9A, each of the shift register circuits 200 in the plurality of shift register units further includes a clock signal terminal CLK, and is configured to be connected to a corresponding clock signal line to receive a first clock signal, a second clock signal, a third clock signal, or a fourth clock signal according to an order in the cascaded shift register units. The first clock signal line CLK1 is connected to, for example, clock signal terminals CLK of (4n−3)th (n is an integer greater than 0) shift register units; the second clock signal line CLK2 is connected to, for example, clock signal terminals CLK of (4n−2)th shift register units; the third clock signal line CLK3 is connected to, for example, clock signal terminals CLK of (4n−1)th shift register units; and the fourth clock signal line CLK4 is connected to, for example, clock signal terminals CLK of (4n)th shift register units.

As illustrated in FIG. 9A, except for last two shift register units, a second input terminal INPUT2 of each of other shift register units is connected to a first output terminal OUT1 of a hind shift register unit which is separated by one shift register unit. For example, second input terminals INPUT2 of the last two shift register units may be configured to receive separately provided second input signals, or, the second input terminal INPUT2 of the last shift register unit is connected to a first output terminal OUT1 of a second shift register unit, and the second input terminal INPUT2 of the last second shift register unit is connected to a first output terminal OUT1 of a first shift register unit. Except for the first and second shift register units, a first input terminal INPUT1 of other shift register units is connected to a first output terminal OUT1 of a front shift register unit which is separated by one shift register unit; and except for the last two shift register units, a first reset terminal RST1 of the other shift register units is connected to the first output terminal OUT1 of the hind shift register unit which is separated by one shift register unit. Except for the first and second shift register units, a second reset terminal RST2 of an output control circuit 100 of the other shift register units is connected to the first output terminal OUT1 of the front shift register unit which is separated by one shift register unit. For example, second reset terminals RST2 of the first and second shift register units may be configured to receive separately provided second reset signals, or, the second reset terminal RST2 of the first shift register unit is connected to the first output terminal OUT1 of the last second shift register unit, and the second reset terminal RST2 of the second shift register unit is connected to the first output terminal OUT1 of the last shift register unit.

For example, first input terminals INPUT1 of the first and second shift register units may be configured to receive the trigger signal STV1, or, the first input terminal INPUT1 of the first shift register unit is connected to the first output terminal OUT1 of the last second shift register unit, and the first input terminal INPUT1 of the second shift register unit is connected to the first output terminal OUT1 of the last shift register unit. First reset terminals RST1 of the last two shift register units may be configured to receive a separately provided first reset signal RESET1, or, the first reset terminal RST1 of the last second shift register unit may be connected to the first output terminal OUT1 of the first shift register unit, and the first reset terminal RST1 of the last shift register unit may be connected to the first output terminal OUT1 of the second shift register unit. For the sake of brevity, the trigger signal STV1 and the first reset signal RESET1 are not illustrated in FIG. 9A.

For example, as illustrated in FIG. 9A, the gate drive circuit 20 may further include a timing controller 300. For example, the timing controller 300 may be configured to be connected to the first clock signal line CLK1, the second clock signal line CLK2, the third clock signal line CLK3, and the fourth clock signal line CLK4, to provide touch scanning control signals and clock signals to each shift register unit. The timing controller 300 may also be configured to provide the trigger signal STV1 and the reset signal. For example, the trigger signal STV1 is provided by the trigger signal line STV1, which is not illustrated in FIG. 9A for the sake of brevity.

Figure 9B:
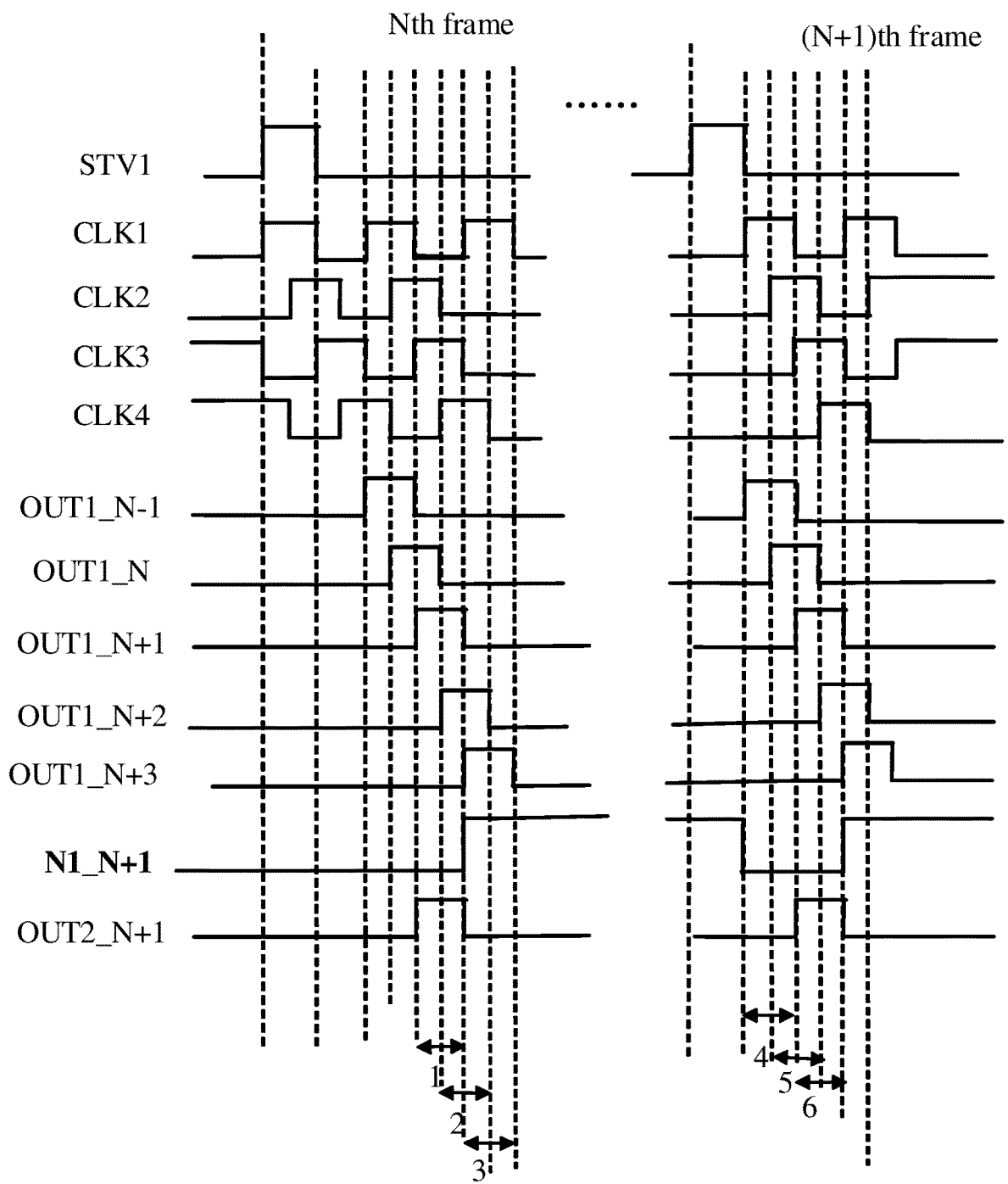
FIG. 9B is a signal timing diagram corresponding to the operation of the gate drive circuit as illustrated in FIG. 9A.

For example, the timing of the trigger signal and the clock signals provided by the trigger signal line STV1, the first clock signal line CLK1, the second clock signal line CLK2, the third clock signal line CLK3, and the fourth clock signal line CLK4 may adopt the signal timing as illustrated in FIG. 9B, to realize the function of outputting gate scanning signals row by row by the gate drive circuit 20.

The clock signal on the clock signal line may be attenuated during transmission, which may cause insufficient charging voltage to latter gate lines. The load on each clock signal line can be reduced by providing clock signals to each shift register unit of the gate drive circuit through a plurality of clock signal lines, thereby improving the charging rate.

It should be noted that the gate drive circuit 20 provided in the embodiments of the present disclosure may further include six, eight, and more clock signal lines, and the embodiments of the present disclosure are not limited thereto.

The operation principle of the gate drive circuit 20 as illustrated in FIG. 9A is described below with reference to the signal timing as illustrated in FIG. 9B. In FIG. 9B, the valid output level is a high level and the invalid output level is a low level. The first clock signal CLK1 to the fourth clock signal CLK4 are sequentially delayed by ½ square wave width, the first clock signal CLK1 and the third clock signal CLK3 are complementary to each other, and the second clock signal CLK2 and the fourth clock signal CLK4 are complementary to each other.

In six phases of a first phase 1 to a sixth phase 6 as illustrated in FIG. 9B, the gate drive circuit 20 can perform following operations respectively. It should be noted that the embodiments of the present disclosure take the working principle of the (N+1)th shift register unit as an example, and the working principle of other shift register units is similar to this and is not described again.

In the first phase 1, the third clock signal line CLK3 provides a high level signal. Because the clock signal terminal CLK of the (N+1)th shift register unit is connected to the third clock signal line CLK3, the high level signal input by the clock signal terminal CLK is output to the first output terminal OUT1_N+1 of the (N+1)th shift register unit during this phase. For example, the high level is referred to as the valid output level, that is, the first output terminal OUT1_N+1 of the (N+1)th shift register unit is in the period when the valid output level is output. The first clock signal line CLK1 provides a low level signal. Because the clock signal terminal CLK of the (N+3)th shift register unit (not illustrated in the figure) is connected to the first clock signal line CLK1, the low level signal input by the clock signal terminal CLK is output to the first output terminal OUT1_N+3 of the (N+3)th shift register unit during this phase. Because the second input terminal INPUT2 of the (N+1)th output control circuit 100 is connected to the first output terminal OUT1_N+3 of the (N+3)th shift register unit, the output control circuit 100 is in a turn-off state during this phase. Because the second output terminal OUT2_N+1 of the output control circuit 100 of the (N+1)th shift register unit is connected to the first output terminal OUT1_N+1 of the shift register circuit 200 of the (N+1)th shift register unit, the second output terminal OUT2_N+1 of the output control circuit 100 of the (N+1)th shift register unit outputs a high level signal during this phase. It should be noted that the level of potential in the signal timing as illustrated in FIG. 9B is only schematic and does not represent the true potential value or relative proportion. Corresponding to the above examples, the high level signal corresponds to the turn-on signal of the N-type transistor, and the low level signal corresponds to the turn-off signal of the N-type transistor.

In the second phase 2, the fourth clock signal line CLK4 provides a high level signal. Because the clock signal terminal CLK of the (N+2)th shift register unit is connected to the fourth clock signal line CLK4, the high level signal input by the clock signal terminal CLK is output to the first output terminal OUT1_N+2 of the (N+2)th shift register unit during this phase. Therefore, the first output terminal OUT1_N+2 of the (N+2)th shift register unit is in the period when the valid output level is output.

In the third phase 3, the third clock signal line CLK3 provides a low level signal. Because the clock signal terminal CLK of the (N+1)th shift register unit is connected to the third clock signal line CLK3, the low level signal input by the clock signal terminal CLK is output to the first output terminal OUT1_N+1 of the (N+1)th shift register unit during this phase. For example, the low level is referred to as the invalid output level, i.e., in this phase, the first output terminal OUT1_N+1 of the (N+1)th shift register unit is in the period when the invalid output level is output. The first clock signal line CLK1 provides a high level signal. Because the clock signal terminal CLK of the (N+3)th shift register unit is connected to the first clock signal line CLK1, the high level signal input by the clock signal terminal CLK is output to the first output terminal OUT1_N+3 of the (N+3)th shift register unit during this phase. Therefore, the first output terminal OUT1_N+3 of the (N+3)th shift register unit is in the period when the valid output level is output.

Because the second input terminal INPUT2 of the (N+1)th shift register unit is connected to the first output terminal OUT1_N+1 of the (N+3)th shift register unit, the second input terminal INPUT2 of the (N+1)th shift register unit receives a high level signal, thereby charging the first node N1 to ensure that the first output terminal OUT N+1 of the (N+1)th shift register unit enters the period when the invalid output signal is output. The operation process when the second input terminal INPUT2 of the (N+1)th shift register unit receives the high level signal is similar to the operation principle of the output control circuit 100 as illustrated in FIG. 7C, and is not described here again.

In the fourth phase 4, the first clock signal line CLK1 provides a high level signal. Because the clock signal terminal CLK of the (N−1)th shift register unit is connected to the first clock signal line CLK1, the high level signal input by the clock signal terminal CLK is output to the first output terminal OUT1_N−1 of the (N−1)th shift register unit during this phase. Therefore, the first output terminal OUT1_N−1 of the (N−1)th shift register unit is in the period when the valid output level is output in this phase. Because the second reset terminal RST2 of the (N+1)th shift register unit is connected to the first output terminal OUT1_N−1 of the (N−1)th shift register unit, the second reset terminal RST2 of the (N+1)th shift register unit receives a high level signal, thereby resetting the first node N1_N+1 of the (N+1)th shift register unit before the first output terminal OUT1_N+1 of the shift register circuit of the (N+1)th shift register unit enters the period when the valid output level is output, thereby ensuring the normal output of the (N+1)th shift register unit. The operation process of the second reset terminal RST2 of the (N+1)th shift register unit when receiving the high level signal is similar to the operation principle of the output control circuit 100 as illustrated in FIG. 7D, and is not repeated here.

In the fifth phase 5, the second clock signal line CLK2 provides a high level signal, and the Nth shift register unit enters the period when the valid output level is output.

In the sixth phase 6, the third clock signal line CLK3 provides a high level signal, and the (N+1)th shift register unit enters the period when the valid output level is output.

It should be noted that in a case where the gate drive circuit 20 provided by the embodiments of the present disclosure is used to drive a display panel, the gate drive circuit 20 may be disposed on a side of the display panel. For example, the display panel includes a plurality of rows of gate lines, each row of gate lines is, for example, used to drive pixel circuits of a row of pixel units, gate electrodes of switching transistors of the pixel circuits are connected to the gate lines, and the first output terminal OUT1 or the second output terminal OUT2 of each shift register unit in the gate drive circuit 20 may be configured to be sequentially connected to the plurality of rows of gate lines for outputting gate scanning signals. It should be noted that the gate drive circuits 20 may be provided on both sides of the display panel to realize double-sided driving, and the embodiments of the present disclosure do not limit the arrangement of the gate drive circuits 20.

Figure 10:
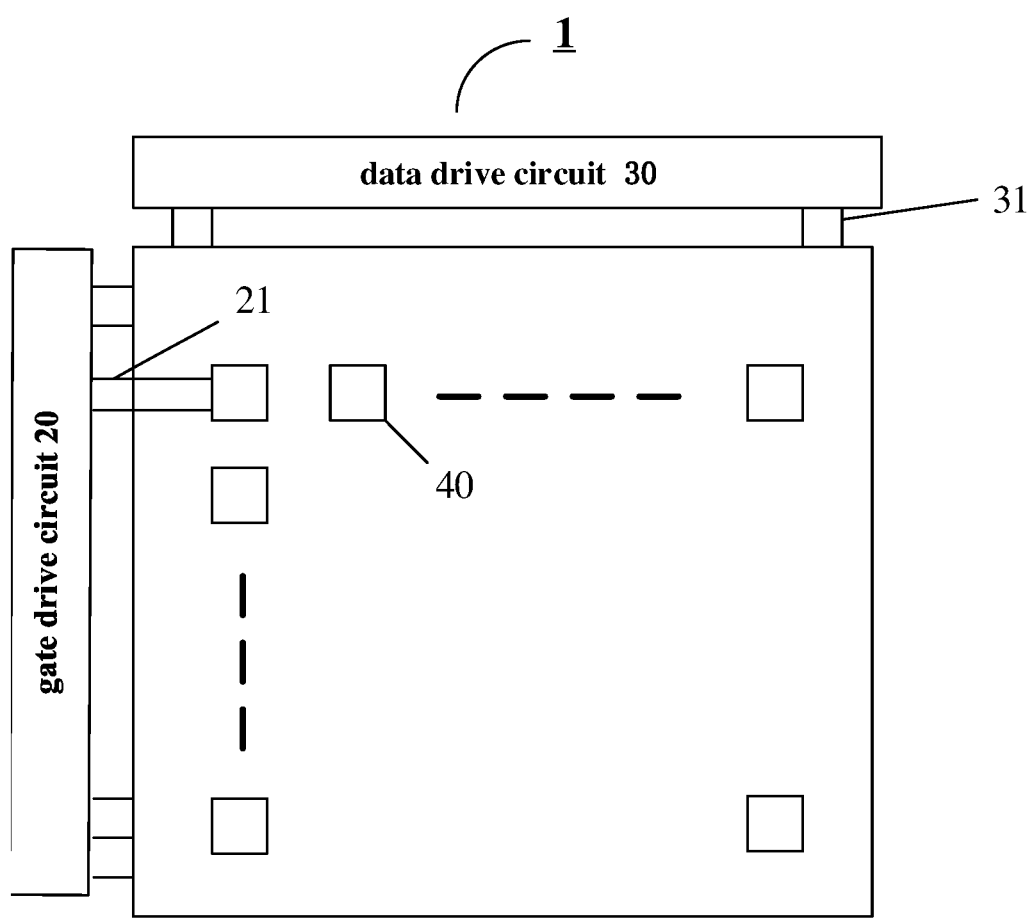
FIG. 10 is a schematic diagram of a display device according to some embodiments of the present disclosure.

The embodiments of the present disclosure also provide a display device 1. As illustrated in FIG. 10, the display device 1 includes the gate drive circuit 20 provided by the embodiments of the present disclosure. The display device 1 includes a pixel array comprising a plurality of pixel units 40. For example, the display device 1 may further include a data drive circuit 30. The data drive circuit 30 is used to provide data signals for the pixel array; and the gate drive circuit 20 is used to provide gate scanning signals for the pixel array. The data drive circuit 30 is electrically connected to the pixel units 40 through data lines 31, and the gate drive circuit 20 is specifically implemented as a GOA, for example, directly prepared on the array substrate of the display device 1 and electrically connected to the pixel units 40 through gate lines 21.

It should be noted that the display device 1 in this embodiment may be any product or component having a display function such as a liquid crystal panel, a liquid crystal television, a display, an organic light-emitting diode (OLED) panel, an OLED TV, an electronic paper display device, a mobile phone, a tablet computer, a notebook computer, a digital photo frame, a navigator, etc. The display device 1 may also include other conventional components such as a display panel, and the embodiments of the present disclosure are not limited thereto.

The technical effect of the display device 1 provided by the embodiments of the present disclosure may be referred to the corresponding description of the gate drive circuit 20 in the above embodiments, and is not described here again.

It should be noted that the entire structure of the display device 1 is not illustrated for clarity and conciseness. In order to realize the necessary functions of the display device, those skilled in the art can set other structures which are not illustrated according to specific application scenarios, and the embodiments of the present disclosure are not limited thereto.

An embodiment of the present disclosure also provides a method of driving a gate drive circuit of a display device for example, which may include following operations:

during a period when a first output terminal of a shift register circuit of a Nth shift register unit does not output the valid output level, controlling a second output terminal of an output control circuit of the Nth shift register unit to output the invalid output level; and resetting a first node of the Nth shift register unit before the first output terminal of the shift register circuit of the Nth shift register unit enters the period when the valid output level is output.

Further, for the example as illustrated in FIG. 3, during the period when the first output terminal of the shift register circuit of the Nth shift register unit does not output the valid output level, controlling the second output terminal of the output control circuit of the Nth shift register unit to output the invalid output level includes: during the period when the first output terminal of the shift register circuit of the Nth shift register unit does not output the valid output level, a third transistor T3 being turned off under control of the second reset signal, and a second transistor T2 being turned on in response to the second input signal received by the second input terminal, thereby controlling a level of a first node N1 (e.g., charging the first node N1) such that a first transistor T1 is turned on under control of the level of the first node N1, to connect the second output terminal to a first voltage terminal VGL, so as to control the second output terminal to output the invalid output level. Resetting the first node of the output control circuit of the Nth shift register unit before the first output terminal of the shift register circuit of the Nth shift register unit enters the period when the valid output level is output includes: before the first output terminal of the shift register circuit of the Nth shift register unit enters the period when the valid output level is output, the second transistor T2 being turned off under control of the second input signal received by the second input terminal, the third transistor T3 being turned on under control of the second reset signal so that the first node N1 is connected to the first voltage terminal VGL, thereby resetting the first node N1, so the first transistor T1 is turned off under control of the level of the first node N1.

Further, in an example, the gate drive circuit includes 2m clock signal lines, and the method may more specifically include following operations sequentially:

in a first phase, the first output terminal of the Nth shift register unit outputting the valid output level;

in a second phase, a first output terminal of an (N+m)th shift register unit outputting the valid output level, the output control circuit of the Nth shift register unit charging the first node thereof under control of the valid output level output from the first output terminal of the (N+m)th shift register unit, and the first output terminal of the Nth shift register unit outputs the invalid output level;

the first output terminal of the Nth shift register unit entering the period when the valid output level is not output; and in a third phase, the Nth shift register unit resetting the first node of the Nth shift register unit in response to the second reset signal before the first output terminal of the shift register circuit of the Nth shift register unit enters the period when the valid output level is output.

For example, for the examples as illustrated in FIG. 7A and FIG. 8A, in a case where two clock signal lines are included, m is equal to 1; and for the example as illustrated in FIG. 9A, in a case where four clock signal lines are included, m is equal to 2. It should be noted that the value of m is related to the number of clock signal lines, which may depend on the specific situations, and the embodiments of the present disclosure are not limited thereto.

It should be noted that the method of driving the other shift register units is similar to that of driving the Nth shift register unit, and is not described here again.

The technical effect of the method of driving the gate drive circuit 20 provided by the embodiments of the present disclosure may be referred to the corresponding description of the gate drive circuit 20 in the above-mentioned embodiments and is not repeated here.

The following statements should be noted.

(1) The accompanying drawings of the embodiments of the present disclosure involve only the structures related to the embodiments of the present disclosure, and other structures may be referred to general designs.

(2) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising a shift register circuit and an output control circuit,
wherein the shift register circuit comprises a first input terminal, a first output terminal, and a first reset terminal, and the shift register circuit is configured to output a valid output level at the first output terminal according to a first input signal received by the first input terminal and is configured to reset according to a first reset signal received by the first reset terminal,
wherein the output control circuit comprises a second input terminal, a second output terminal, and a second reset terminal, the second output terminal is electrically connected to the first output terminal, and the output control circuit is configured to output an invalid output level at the second output terminal according to a second input signal received by the second input terminal, thereby controlling a level of the first output terminal to be the invalid output level, and is configured to reset according to a second reset signal received by the second reset terminal, and
wherein the output control circuit further comprises a control selection sub-circuit, the control selection sub-circuit is connected to a first node, the second output terminal, and a first voltage terminal, and the control selection sub-circuit is configured to output the invalid output level at the second output terminal under control of a level of the first node, thereby controlling the level of the first output terminal at the invalid output level during a non-output period.

2. The shift register unit according to claim 1, wherein the output control circuit further comprises a first node control sub-circuit and a first node reset sub-circuit;
the first node control sub-circuit is connected to the second input terminal, the first node, and the first voltage terminal, and the first node reset sub-circuit is connected to the second reset terminal, the first node, and the first voltage terminal;
the first node control sub-circuit is configured to adjust the level of the first node to a level that turns on the control selection sub-circuit, in response to the second input signal; and
the first node reset sub-circuit is configured to reset the first node in response to the second reset signal.

3. The shift register unit according to claim 2, wherein the first node control sub-circuit comprises a second transistor and a first storage capacitor;
a gate electrode of the second transistor and a first electrode of the second transistor are electrically connected to each other, and are configured to be connected to the second input terminal to receive the second input signal, and a second electrode of the second transistor is configured to be connected to the first node; and
a first electrode of the first storage capacitor is connected to the first node, and a second electrode of the first storage capacitor is connected to a reference voltage terminal to receive a reference voltage.

4. The shift register unit according to claim 2, wherein the first node reset sub-circuit comprises a third transistor,
a gate electrode of the third transistor is connected to the second reset terminal to receive the second reset signal, a first electrode of the third transistor is connected to the first node, and a second electrode of the third transistor is connected to the first voltage terminal to receive a first voltage.

5. The shift register unit according to claim 2, wherein the control selection sub-circuit comprises a first transistor;
a gate electrode of the first transistor is connected to the first node, a first electrode of the first transistor is connected to the second output terminal, and a second electrode of the first transistor is connected to the first voltage terminal to receive a first voltage;
the first node control sub-circuit comprises a second transistor and a first storage capacitor;
a gate electrode of the second transistor and a first electrode of the second transistor are electrically connected to each other, and are configured to be connected to the second input terminal to receive the second input signal, and a second electrode of the second transistor is configured to be connected to the first node;
a first electrode of the first storage capacitor is connected to the first node, and a second electrode of the first storage capacitor is connected to a reference voltage terminal to receive a reference voltage;
the first node reset sub-circuit comprises a third transistor;
a gate electrode of the third transistor is connected to the second reset terminal to receive the second reset signal, a first electrode of the third transistor is connected to the first node, and a second electrode of the third transistor is connected to the first voltage terminal to receive the first voltage;
the shift register circuit further comprises an input circuit, a pull-up node reset circuit and an output circuit;
the input circuit is connected to the first input terminal and is configured to control a level of a pull-up node according to the first input signal received by the first input terminal;
the pull-up node reset circuit is connected to the first reset terminal and is configured to reset the pull-up node according to the first reset signal received by the first reset terminal; and
the output circuit is connected to the first output terminal and is configured to output a clock signal to the first output terminal under control of the level of the pull-up node.

6. A gate drive circuit, comprising p shift register units according to claim 5, wherein the p shift register units are cascaded, and p is an integer greater than 1.

7. A gate drive circuit, comprising p shift register units according to claim 2, wherein the p shift register units are cascaded, and p is an integer greater than 1.

8. The shift register unit according to claim 1, wherein the control selection sub-circuit comprises a first transistor,
a gate electrode of the first transistor is connected to the first node, a first electrode of the first transistor is connected to the second output terminal, and a second electrode of the first transistor is connected to the first voltage terminal to receive a first voltage.

9. The shift register unit according to claim 1, wherein the shift register circuit further comprises an input circuit, a pull-up node reset circuit, and an output circuit;
the input circuit is connected to the first input terminal and is configured to control a level of a pull-up node according to the first input signal received by the first input terminal;
the pull-up node reset circuit is connected to the first reset terminal and is configured to reset the pull-up node according to the first reset signal received by the first reset terminal; and the output circuit is connected to the first output terminal and is configured to output a clock signal to the first output terminal under control of the level of the pull-up node.

10. A gate drive circuit, comprising p shift register units according to claim 1, wherein the p shift register units are cascaded, and p is an integer greater than 1.

11. The gate drive circuit according to claim 10, wherein, except for a (p−m+1)th to a mth shift register units, a second input terminal of one of the other shift register units is connected to a first output terminal of a hind shift register unit which is separated by m−1 shift register units;

except for a first to the mth shift register units, a first input terminal of one of other shift register units is connected to a first output terminal of a front shift register unit which is separated by m−1 shift register units;

except for the (p−m+1)th to the mth shift register units, a first reset terminal of one of the other shift register units is connected to the first output terminal of the hind shift register unit which is separated by the m−1 shift register units; and m is an integer greater than 0 and p is greater than m.

12. The gate drive circuit according to claim 11, further comprising a trigger signal line, wherein a second reset terminal of the shift register units is connected to the trigger signal line.

13. The gate drive circuit according to claim 11, wherein, except for the first to the mth shift register units, a second reset terminal of one of the other shift register units is connected to the first output terminal of the front shift register unit which is separated by the m−1 shift register units.

14. The gate drive circuit according to claim 11, wherein, except for the first to the mth shift register units, a second reset terminal of one of the other shift register units is connected to the first output terminal of the front shift register unit which is separated by the m−1 shift register units.

15. A display device, comprising the gate drive circuit according to claim 10.

16. A method of driving the gate drive circuit according to claim 10, comprising:

controlling a second output terminal of an output control circuit of an Nth shift register unit to output the invalid output level during a period when a first output terminal of a shift register circuit of the Nth shift register unit does not output the valid output level; and resetting a first node of the output control circuit of the Nth shift register unit before the first output terminal of the shift register circuit of the Nth shift register unit enters the period when the valid output level is output, wherein N is an integer greater than 0.

17. The method according to claim 16, wherein the controlling the second output terminal of the output control circuit of the Nth shift register unit to output the invalid output level during the period when the first output terminal of the shift register circuit of the Nth shift register unit does not output the valid output level comprises:

during the period when the first output terminal of the shift register circuit of the Nth shift register unit does not output the valid output level, a third transistor being turned off under control of the second reset signal, and a second transistor being turned on in response to the second input signal received by the second input terminal, thereby controlling a level of a first node so that a first transistor is turned on under control of the level of the first node, to connect the second output terminal with a first voltage terminal, to control the second output terminal to output the invalid output level.

18. The method according to claim 16, wherein the resetting the first node of the output control circuit of the Nth shift register unit before the first output terminal of the shift register circuit of the Nth shift register unit enters the period when the valid output level is output comprises:

before the first output terminal of the shift register circuit of the Nth shift register unit enters the period when the valid output level is output, a second transistor being turned off under control of the second input signal received by the second input terminal, and a third transistor being turned on under control of the second reset signal, so that the first node is connected to a first voltage terminal, thereby resetting the first node, to turn off a first transistor under control of a level of the first node.

* * * * *